(12) United States Patent
Yeh et al.

(10) Patent No.: US 11,710,689 B2
(45) Date of Patent: Jul. 25, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Chang-Lin Yeh, Kaohsiung (TW); Yu-Chang Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 106 days.

(21) Appl. No.: 17/115,629

(22) Filed: Dec. 8, 2020

(65) Prior Publication Data

US 2021/0090982 A1    Mar. 25, 2021

Related U.S. Application Data

(63) Continuation of application No. 16/268,385, filed on Feb. 5, 2019, now Pat. No. 10,861,779.

(60) Provisional application No. 62/688,937, filed on Jun. 22, 2018.

(51) Int. Cl.
| | | |
|---|---|---|
| *H01L 23/498* | (2006.01) | |
| *H01L 21/48* | (2006.01) | |
| *H01L 21/56* | (2006.01) | |
| *H01L 23/31* | (2006.01) | |
| *H01L 25/16* | (2023.01) | |

(52) U.S. Cl.
CPC .... *H01L 23/49816* (2013.01); *H01L 21/4853* (2013.01); *H01L 21/56* (2013.01); *H01L 23/3128* (2013.01); *H01L 23/49822* (2013.01); *H01L 23/49866* (2013.01); *H01L 25/16* (2013.01)

(58) Field of Classification Search
CPC .......... H01L 23/49816; H01L 23/3128; H01L 21/56
USPC ......................................................... 257/659
See application file for complete search history.

(56) References Cited

U.S. PATENT DOCUMENTS

| | | | |
|---|---|---|---|
| 8,841,168 | B2 | 9/2014 | Schwarz et al. |
| 9,597,752 | B2 | 3/2017 | Cheng et al. |
| 10,256,173 | B2 | 4/2019 | Wu et al. |
| 2002/0151164 | A1 | 10/2002 | Jiang et al. |

(Continued)

OTHER PUBLICATIONS

Non-Final Office Action for U.S. Appl. No. 16/268,385, dated Dec. 23, 2019, 12 pages.

(Continued)

*Primary Examiner* — Quoc D Hoang
(74) *Attorney, Agent, or Firm* — Foley & Lardner LLP

(57) ABSTRACT

A semiconductor device package includes a substrate, a first solder paste, an electrical contact and a first encapsulant. The substrate includes a conductive pad. The first solder paste is disposed on the pad. The electrical contact is disposed on the first solder paste. The first encapsulant encapsulates a portion of the electrical contact and exposes the surface of the electrical contact. The electrical contact has a surface facing away from the substrate. A melting point of the electrical contact is greater than that of the first solder paste. The first encapsulant includes a first surface facing toward the substrate and a second surface opposite to the first surface. The second surface of the first encapsulant is exposed to air.

19 Claims, 26 Drawing Sheets

(56) References Cited

U.S. PATENT DOCUMENTS

| | | | |
|---|---|---|---|
| 2011/0272819 A1 | 11/2011 | Park et al. | |
| 2013/0200528 A1 | 8/2013 | Lin et al. | |
| 2015/0279815 A1 | 10/2015 | Do et al. | |
| 2016/0056127 A1* | 2/2016 | Lee | H01L 24/49 257/659 |
| 2017/0141064 A1 | 5/2017 | Murai et al. | |
| 2017/0141081 A1* | 5/2017 | Lee | H01L 25/0657 |
| 2017/0317036 A1 | 11/2017 | Myers et al. | |
| 2019/0019758 A1* | 1/2019 | Kim | H01L 25/50 |
| 2020/0118913 A1 | 4/2020 | Matsukawa et al. | |

OTHER PUBLICATIONS

Final Office Action for U.S. Appl. No. 16/268,385, dated May 14, 2020, 12 pages.

Notice of Allowance for U.S. Appl. No. 16/268,385, dated Aug. 6, 2020, 8 pages.

\* cited by examiner

SEMICONDUCTOR DEVICE PACKAGE AND METHOD OF MANUFACTURING THE SAME

CROSS-REFERENCE TO RELATED APPLICATIONS

This application is a continuation of U.S. patent application Ser. No. 16/268,385 filed Feb. 5, 2019, which claims the benefit of and priority to U.S. Provisional Application No. 62/688,937, filed Jun. 22, 2018, the contents of which are incorporated herein by reference in their entirety.

BACKGROUND

1. Technical Field

The present disclosure relates to a semiconductor device package. In particular, the present disclosure relates to the semiconductor device package including an electrical contact with a high-melting-point part and an encapsulant in contact with the high-melting-point part of the electrical contact.

2. Description of the Related Art

A semiconductor device package may include multiple electronic components to increase its performance and functionality. To reduce the area or footprint of a semiconductor device package, electronic components may be mounted to both an upper surface and a lower surface of a substrate. In order to protect the electronic components mounted on the substrate, a double-sided molding technique can be used to form a package body on each of the upper surface and the lower surface of the substrate. However, forming package bodies on both sides of the substrate would increase the thickness of the semiconductor device package. It is challenging to develop a double-sided molding module with a relatively thinner thickness.

SUMMARY

In some embodiments, according to one aspect, a semiconductor device package includes a substrate, a first solder paste, an electrical contact and a first encapsulant. The substrate includes a conductive pad. The first solder paste is disposed on the pad. The electrical contact is disposed on the first solder paste. The first encapsulant encapsulates a portion of the electrical contact and exposes the surface of the electrical contact. The electrical contact has a surface facing away from the substrate. A melting point of the electrical contact is greater than that of the first solder paste. The first encapsulant includes a first surface facing toward the substrate and a second surface opposite to the first surface. The second surface of the first encapsulant is exposed to air.

In some embodiments, according to one aspect, a semiconductor device package includes a substrate, a first solder paste, an electrical contact and an encapsulant. The substrate includes a conductive pad. The first solder paste is disposed on the conductive pad. An electrical contact is disposed on the first solder paste. The encapsulant encapsulates the electrical contact. The electrical contact includes a high-melting-point part. A melting point of the high-melting-point part of the electrical contact is greater than that of the first solder paste. The encapsulant is in contact with the high-melting-point part of the electrical contact.

In some embodiments, according to another aspect, a method is disclosed for manufacturing a semiconductor device package. The method includes: disposing a first solder paste on a substrate; disposing an electrical contact on the first solder paste, wherein the electrical contact includes a high-melting-point part, a melting point of the high-melting-point part of the electrical contact is greater than that of the first solder paste; forming an encapsulant to encapsulate the electrical contact, the encapsulant being in contact with the high-melting-point part of the electrical contact; and disposing a second solder paste on the electrical contact.

DETAILED DESCRIPTION

Figure 1A:
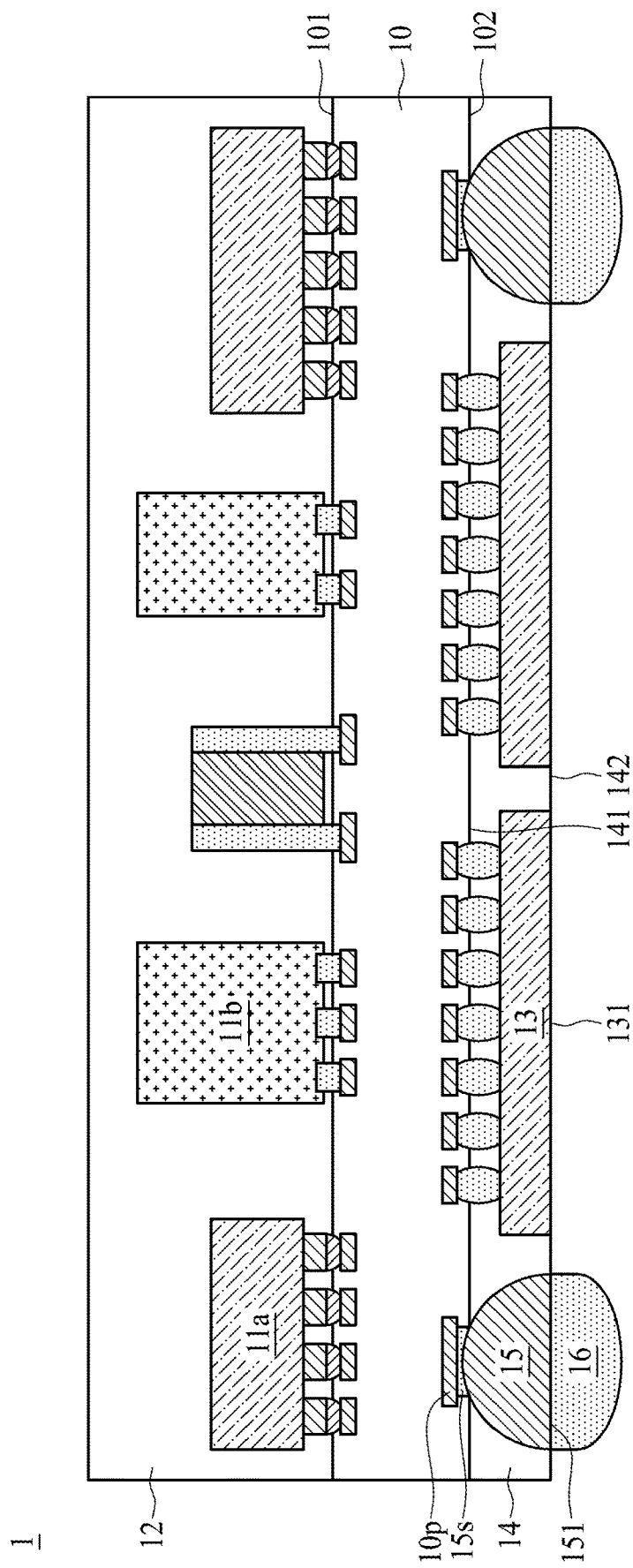
FIG. 1A illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a semiconductor device package 1 in accordance with some embodiments of the present disclosure. The semiconductor device package 1 includes a substrate 10, electronic components 11a, 11b, and 13, encapsulants 12 and 14, a solder paste 15s, an electrical contact 15, and a solder paste 16. In some embodiments, the semiconductor device package 1 is a double-sided module. The semiconductor device package 1 may include a conformal shield (not shown) disposed on exterior surfaces of the encapsulants 12, 14 and the substrate 10 to provide electromagnetic interference (EMI) shielding.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL). The substrate 10 has an upper surface 101 and a lower surface 102 opposite to the upper surface 101. The substrate 10 has a conductive pad 10p on or adjacent to the lower surface 102. The solder paste 15s is disposed on the conductive pad 10p.

The electronic components 11a and 11b are disposed on the upper surface 101 of the substrate 10. The electronic component 11a may be an active component, such as an integrated circuit (IC) chip or a die. The electronic component 11b may be a passive component, such as a capacitor, a resistor or an inductor. The electronic components 11a and 11b may be electrically connected to one or more of another electronic component and/or the substrate 10 (e.g., to the interconnection layer), and electrical connection may be attained by way of flip-chip or wire-bond techniques.

The encapsulant 12 is disposed on the upper surface 101 of the substrate 10. The encapsulant 12 covers or encapsulates the substrate 10 and the electronic components 11a and 11b. In some embodiments, the encapsulant 12 includes an epoxy resin having fillers, a molding compound (e.g., an epoxy molding compound or other molding compound), a polyimide, a phenolic compound or material, a material with a silicone dispersed therein, or a combination thereof.

The electronic component 13 is disposed on the lower surface 102 of the substrate 10. The electronic component 13 has a surface 131. In some embodiments, the surface 131 is a backside surface of the electronic component 13. The electronic component 13 is adjacent to the electrical contact 15. The electronic component 13 may be an active component (such as an IC chip or a die) or a passive component (such as a capacitor, a resistor or an inductor). The electronic component 13 may be electrically connected to the substrate 10 (e.g., to the interconnection layer), and electrical connection may be attained by way of flip-chip or wire-bond techniques. The electronic component 13 may be electrically connected to the electronic components 11a and 11b through the interconnection layer within the substrate 10.

The electrical contact 15 is disposed on the solder paste 15s. The solder paste 15s may join the electrical contact 15 to the conductive pad 10p. The electrical contact 15 is disposed on the lower surface 102 of the substrate 10. The electrical contact 15 may be electrically connected to the upper surface 101 of the substrate 10 through the interconnection structure. In some embodiments, the electrical contacts 15 are Controlled Collapse Chip Connection (C4) bumps, solder bumps, one or more Land Grid Arrays (LGA), or a combination of two or more thereof.

A portion of the electrical contact 15 is exposed from the encapsulant 14. For example, a surface 151 (e.g., a cut surface) of the electrical contact 15 is exposed from the encapsulant 14. In some embodiments, the surface 151 of the electrical contact 15 is substantially coplanar with a lower surface 142 of the encapsulant 14. In some embodiments, the electrical contact 15 is formed of or includes copper (Cu), alloy (e.g. CuAg or CuAu), or a high-melting-point solder material (e.g. high-melting-point Sn). A melting point of the electrical contact 15 is greater than that of the solder pastes 15s and 16. In some embodiments, the electrical contact 15 is in the shape of a portion of a ball. In the case that the electrical contact 15 is a portion of a metal ball, a distance between the lower surface 102 of the substrate 10 and the surface 151 of the electrical contact 15 is less than a diameter of an entire metal ball. In some embodiments, the electrical contact 15 may be a portion of a metal ball, alloy ball, plastic ball or metal pillar.

The encapsulant 14 includes an upper surface 141 facing toward the substrate 10 and a lower surface 142 opposite to the upper surface 141. The encapsulant 14 covers or encapsulates the lower surface 102 of the substrate 10 and the electronic component 13. The lower surface 142 of the encapsulant 14 at least partially exposes the surface 151 of the electrical contact 15. The lower surface 142 of the encapsulant 14 is exposed to air. The lower surface 142 of the encapsulant 14 is substantially coplanar with the surface 151 of the electrical contact 15. The lower surface 142 of the encapsulant 14 is substantially coplanar with the surface 131 of the electronic component 13. In some embodiments, the surface 131 of the electronic component 13 and the surface 151 of the electrical contacts 15 are exposed from the encapsulant 14. In some embodiments, the encapsulant 14 may include the same material as that of the encapsulant 12. The encapsulant 14 may include a different material from that of the encapsulant 12.

The solder paste 16 is disposed on the surface 151 of the electrical contact 15 to prevent the electrical contact 15 from oxidation and to provide an electrical connection between the semiconductor device package 1 and any other devices or elements. The solder paste 16 may act as a conductive pad. In some embodiments, the solder paste 16 may include the same material as that of the solder paste 15s. The solder paste 16 may include a different material from that of the solder paste 15s. In some embodiments, the solder paste 16 may be omitted.

Figure 1B:
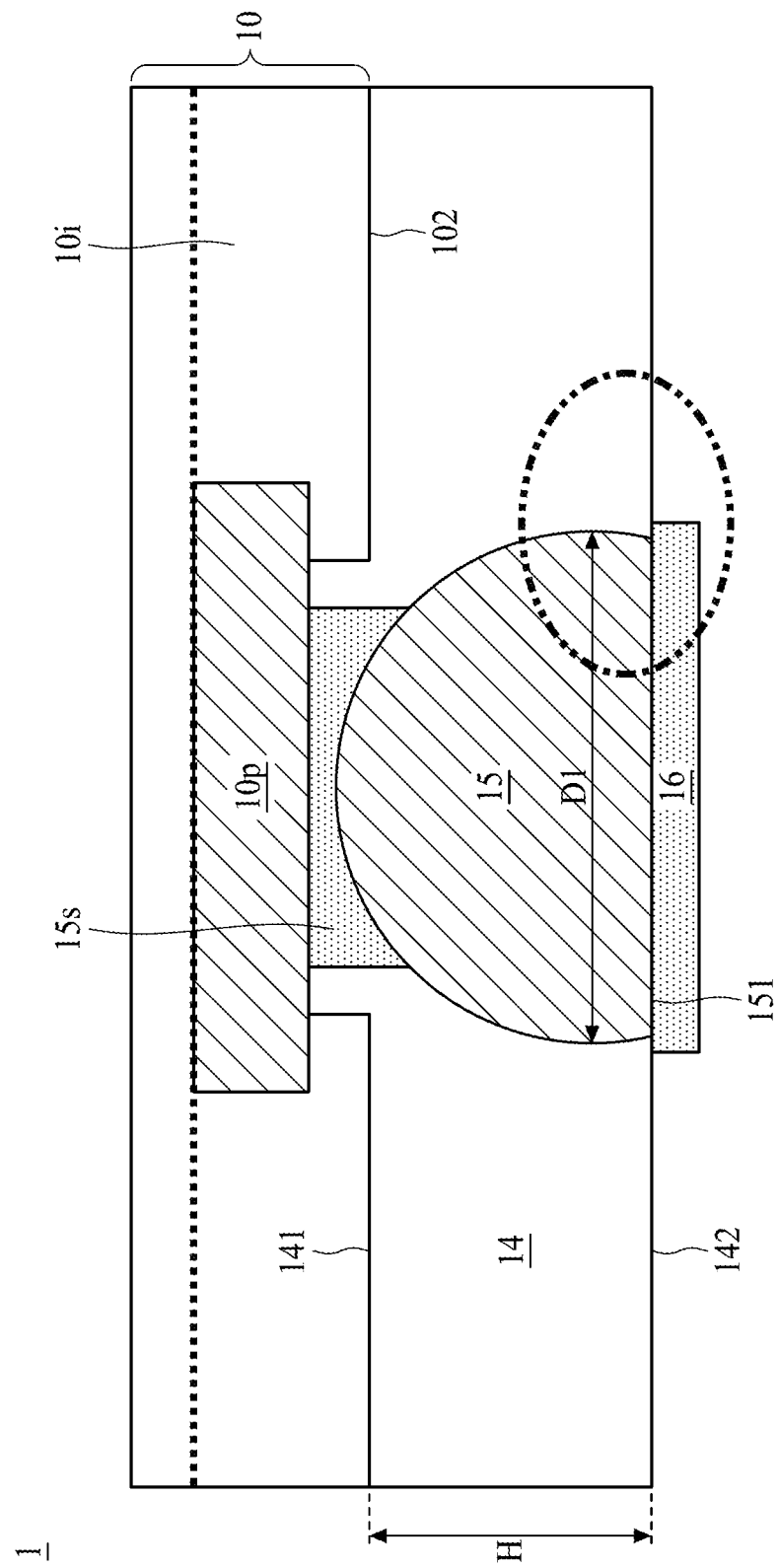
FIG. 1B illustrates a cross-sectional view of an enlarged view of a portion of a semiconductor device package according to some embodiments of the present disclosure.

FIG. 1B is a cross-sectional view of an enlarged view of a portion of the semiconductor device package 1 according to some embodiments of the present disclosure. The substrate 10 includes a dielectric/insulating layer 10i. The dielectric layer 10i may be a solder resist layer. The dielectric layer 10i partially covers the conductive pad 10p. The dielectric layer 10i is spaced apart from the solder paste 15s by the encapsulant 14. The encapsulant 14 is in contact with the dielectric layer 10i, the conductive pad 10p, the solder paste 15s, and the electrical contact 15. The encapsulant 14 may be in contact with the solder paste 16. In some embodiments, the encapsulant 14 may be spaced apart from the solder paste 16.

The electrical contact 15 is a portion of an entire copper ball or a high-melting-point solder ball. The encapsulant 14 covers more than half of the entire ball to form a lock structure (circled by a dotted-line circle) to prevent the delamination between the electrical contact 15 and the encapsulant 14 (e.g., ball drop). In other words, the distance H between the lower surface 102 of the substrate 10 and a surface 151 (e.g., a cut surface) of the electrical contact 15 is less than the diameter of an entire metal ball. A width of the surface 151 of the electrical contact 15 is greater than a radius of the entire metal ball. The width of the surface 151 of the electrical contact 15 is less than a diameter (D1) of the entire ball. A diameter of the electrical contact 15 could be adjusted to be as small as possible to meet a specification of fine pitch, which would increase a number of input/output terminals.

In some embodiments, the electrical contact 15 has a high melting point that is greater than the reflow temperature (e.g., 260° C.). The electrical contact 15 includes a high-melting-point part. The entire electrical contact 15 has a high melting point. A melting point of the high-melting-point part of the electrical contact 15 is greater than that of the solder pastes 15s and 16. Accordingly, the appearance of the electrical contact 15 would not be affected by the high temperature during a reflow operation, which will prevent the electrical contact 15 from deformation. Since the electrical contact 15 can withstand the temperature of the reflow operation, the distance H between the lower surface 102 of the substrate 10 and the surface 151 of the electrical contact 15 is not limited (e.g., can be greater than, equal to or less than a radius of the entire high-melting-point solder ball). The distance H between the lower surface 102 of the substrate 10 and the surface 151 of the electrical contact 15 may be easily controlled such that the design window could be flexible. A thickness of the encapsulant 14 may be decreased. The dimension of the semiconductor device package 1 may be scaled.

Figure 2A:
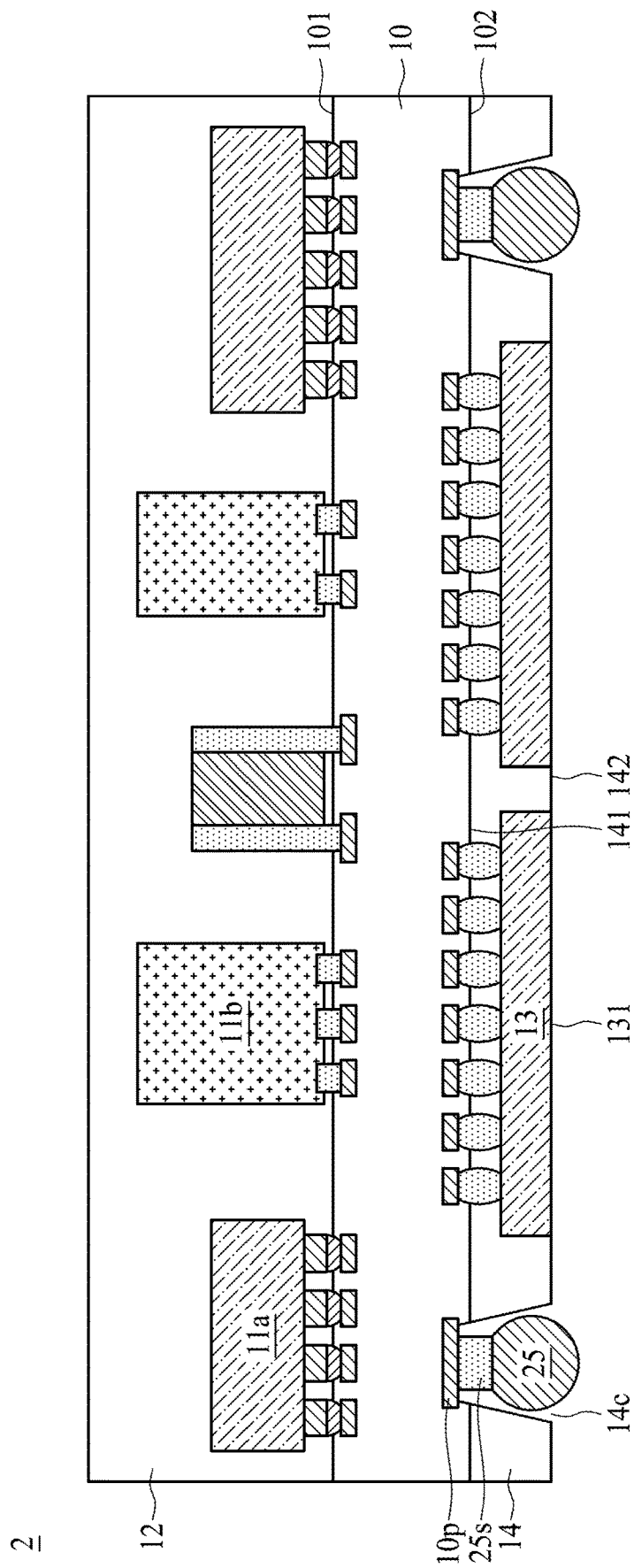
FIG. 2A illustrates a cross-sectional view of a semiconductor device package according to some embodiments of the present disclosure.

FIG. 2A is a cross-sectional view of a semiconductor device package 2 in accordance with some embodiments of the present disclosure. The semiconductor device package 2 is similar to the semiconductor device package 1 in FIG. 1A except that an electrical contact 25 of the semiconductor device package 2 is an entire high-melting-point metal ball (e.g. a copper ball or a high-melting-point solder ball).

The encapsulant 14 includes a recess 14c to accommodate the electrical contact 25. The electrical contact 25 is disposed on the conductive pad 10p on the surface 102 of the substrate 10. In some embodiments, the electrical contact 25 protrudes beyond the surface 142 of the encapsulant 14 to a distance greater than or equal to 30 μm. In some embodiments, the electrical contact 25 is in contact with the sidewall of the recess 14c of the encapsulant 14. Alternatively, the electrical contact 25 is spaced apart from the sidewall of the recess 14c of the encapsulant 14. The surface 131 of the electronic component 13 could be covered by the encapsulant 14 or exposed from the encapsulant 14 depending on different embodiments.

In the case that a thickness of the encapsulant 14 is thick, a size of the electrical contact 25 may be large. In the case that the thickness of the encapsulant 14 is thin, the size of the electrical contact 25 may be small. A size of the recess 14c may be adjusted.

Figure 2B:
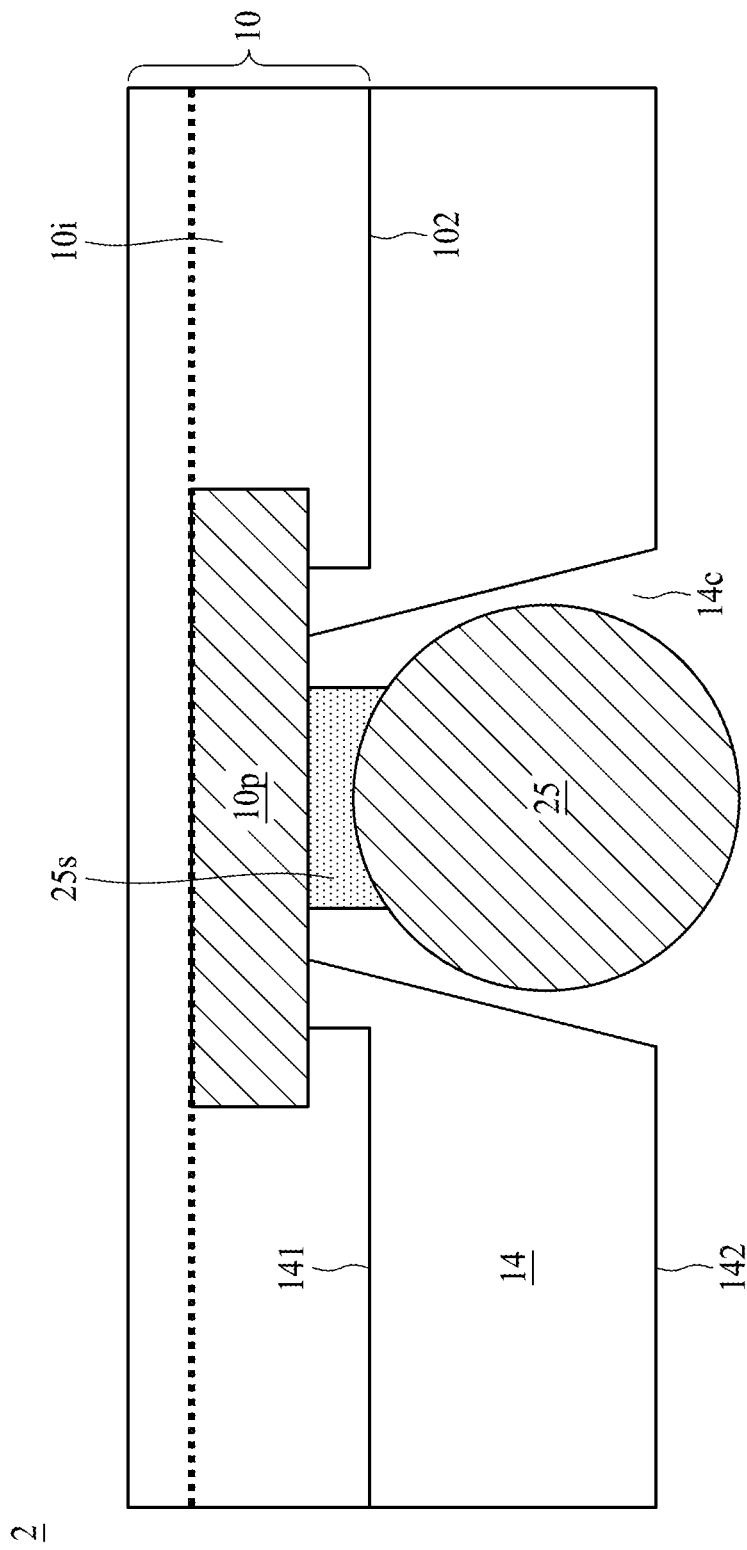
FIG. 2B illustrates a cross-sectional view of an enlarged view of a portion of a semiconductor device package according to some embodiments of the present disclosure.

FIG. 2B is a cross-sectional view of an enlarged view of a portion of the semiconductor device package 2 according to some embodiments of the present disclosure. The electrical contact 25 may be a copper ball. In some embodiments, the electrical contact 25 may be covered by a nickel (Ni) layer. In some embodiments, the thickness of the Ni layer is about 1 μm. The electrical contact 25 is connected to the conductive pad 10p of the substrate 10 through a solder paste 25s.

The substrate 10 includes the dielectric layer 10i. The dielectric layer 10i partially covers the conductive pad 10p. The dielectric layer 10i is spaced apart from the solder paste 25s and the electrical contact 25. The encapsulant 14 is in contact with the dielectric layer 10i and the conductive pad 10p. The encapsulant 14 may be in contact with the electrical contact 25. The encapsulant 14 is spaced apart from the solder paste 25s.

The recess 14c exposes at least a portion of the conductive pad 10p of the substrate 10. The recess 14c exposes the solder paste 25s and the electrical contact 25.

Figure 2C:
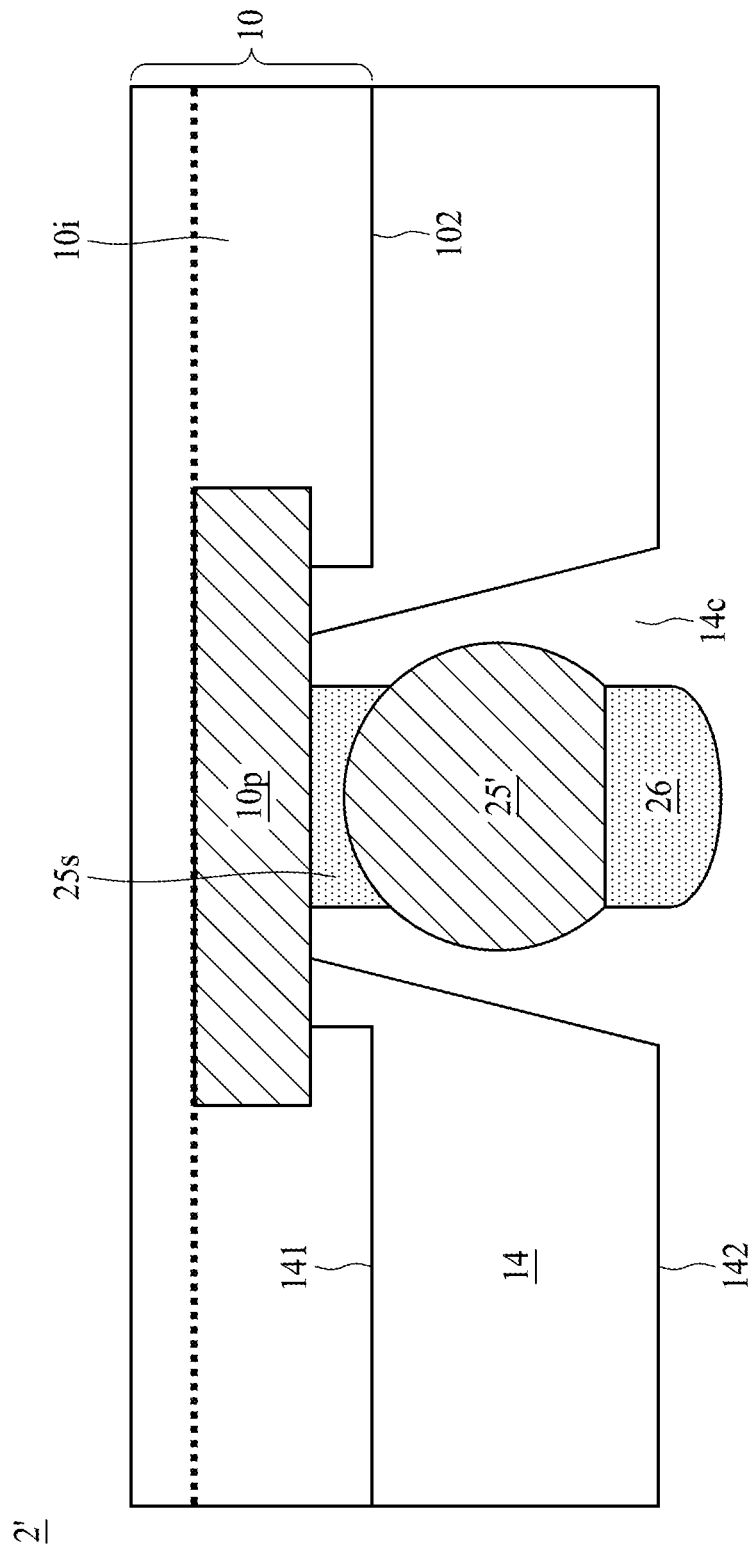
FIG. 2C illustrates a cross-sectional view of an enlarged view of a portion of a semiconductor device package according to some embodiments of the present disclosure.

FIG. 2C is a cross-sectional view of an enlarged view of a portion of a semiconductor device package 2' according to some embodiments of the present disclosure. The semiconductor device package 2' is similar to the semiconductor device package 2 except that the semiconductor device package 2' includes an electrical contact 25' with a relatively small size. For example, the electrical contact 25' does not protrude the lower surface 142 of the encapsulant 14. For example, the diameter of the electrical contact 25' is equal to or less than the depth of the recess 14c. This arrangement would reduce a size of the electrical contact 25' and the recess 14c, which is applicable to fine-pitch connections. The electrical contact 25' may be a copper ball. In some embodiments, the electrical contact 25' may be covered by a Ni layer. In some embodiments, the thickness of the Ni layer is about 1 μm. The electrical contact 25' is connected to the conductive pad 10p of the substrate 10 through a solder paste 25s.

A solder paste 26 is disposed on the electrical contact 25' to prevent the electrical contact 25' from oxidation and to provide an electrical connection between the semiconductor device package 2' and any other devices or elements. The solder paste 26 may act as a conductive pad. The solder paste 26 is spaced apart from the encapsulant 14. In some embodiments, the solder paste 26 may include the same material as that of the solder paste 25s. The solder paste 26 may include a different material from that of the solder paste 25s.

The recess 14c exposes at least a portion of the conductive pad 10p of the substrate 10. The recess 14c exposes the solder paste 25s, the electrical contact 25, and the solder paste 26.

Figure 2D:
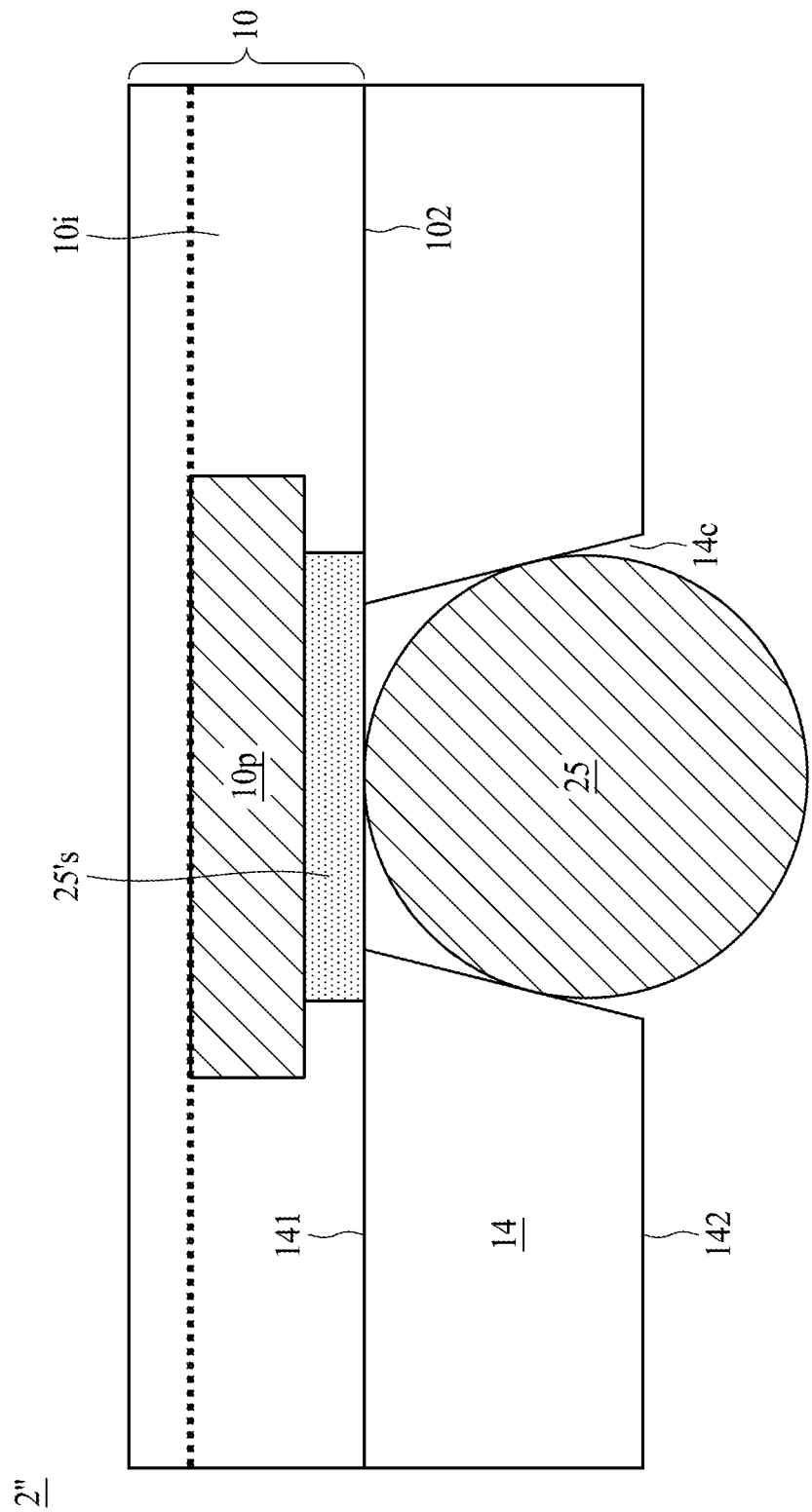
FIG. 2D illustrates a cross-sectional view of an enlarged view of a portion of a semiconductor device package according to some embodiments of the present disclosure.

FIG. 2D is a cross-sectional view of a semiconductor device package 2" in accordance with some embodiments of the present disclosure. The semiconductor device package 2" is similar to the semiconductor device package 2 in FIG. 2B except that a solder paste 25's is disposed on the conductive pad 10p and in contact with the dielectric layer 10i. The electrical contact 25 is disposed on the solder paste 25's. The solder paste 25's is exposed by the recess 14c of the encapsulant 14.

The encapsulant 14 is in contact with the dielectric layer 10i and the solder paste 25's. The encapsulant 14 is in contact with the electrical contact 25. In some embodiments, the encapsulant 14 is spaced apart from the electrical contact 25.

Figure 2E:
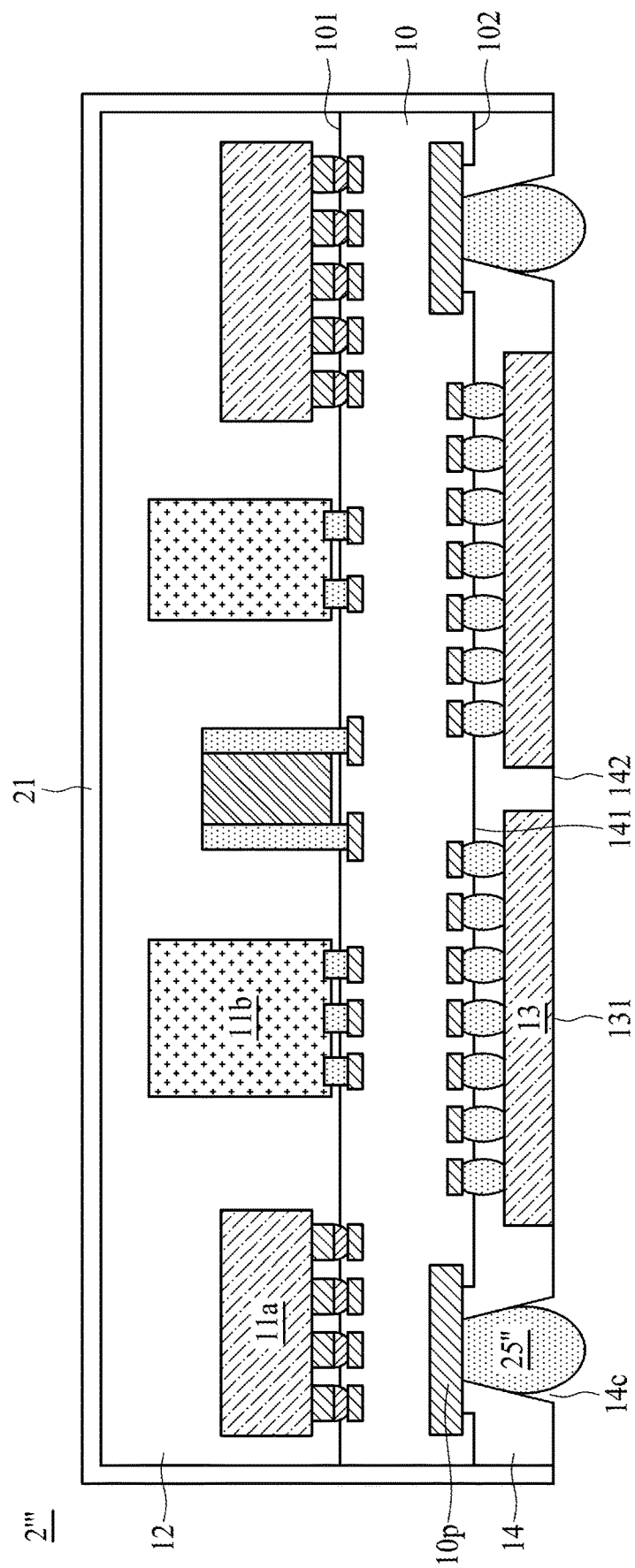
FIG. 2E illustrates a cross-sectional view of a semiconductor device package according to some embodiments of the present disclosure.

FIG. 2E is a cross-sectional view of a semiconductor device package 2''' in accordance with some embodiments of the present disclosure. The semiconductor device package 2''' is similar to the semiconductor device package 2 in FIG. 2A except that a conductive layer 21 is disposed on the encapsulants 12 and 14 and a portion of the substrate 10 and an electrical contact 25" is disposed on the conductive pad 10p. The electrical contact 25" may include a solder material (e.g. Sn).

The conductive layer 21 is in contact with the encapsulants 12 and 14 and sidewalls of the substrate 10. The conductive layer 21 may work as a shielding layer to improve electromagnetic interference (EMI) shielding. Under the spirit of the present disclosure, the conductive layer 21 may be added to the structure as illustrated and described with reference to FIG. 1A, FIG. 2A, FIG. 3A, FIG. 4A, FIG. 4B, or FIG. 4C.

Figure 2F:
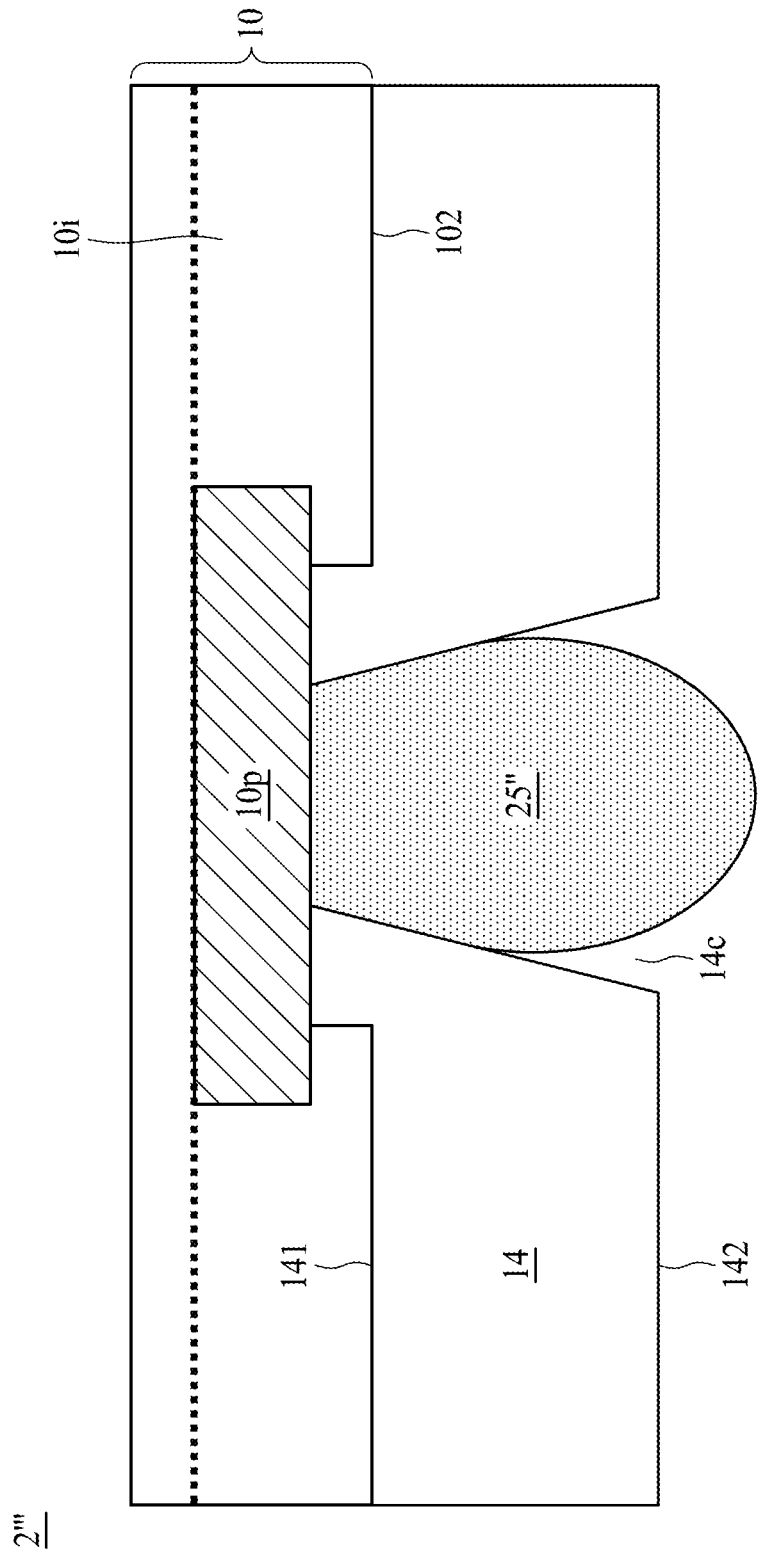
FIG. 2F illustrates a cross-sectional view of an enlarged view of a portion of a semiconductor device package according to some embodiments of the present disclosure.

FIG. 2F is a cross-sectional view of an enlarged view of a portion of the semiconductor device package 2''' according to some embodiments of the present disclosure. The substrate 10 includes the dielectric layer 10i. The dielectric layer 10i partially covers the conductive pad 10p. The dielectric layer 10i is spaced apart from the electrical contact 25". The encapsulant 14 is in contact with the dielectric layer 10i and the conductive pad 10p. The encapsulant 14 may be in contact with the electrical contact 25".

The conductive pad 10p is partially exposed from the dielectric layer 10i. The conductive pad 10p is partially exposed from the recess 14c of the encapsulant 14. The electrical contact 25" is at least partially disposed within the recess 14c and on a portion of the conductive pad 10p.

Figure 3A:
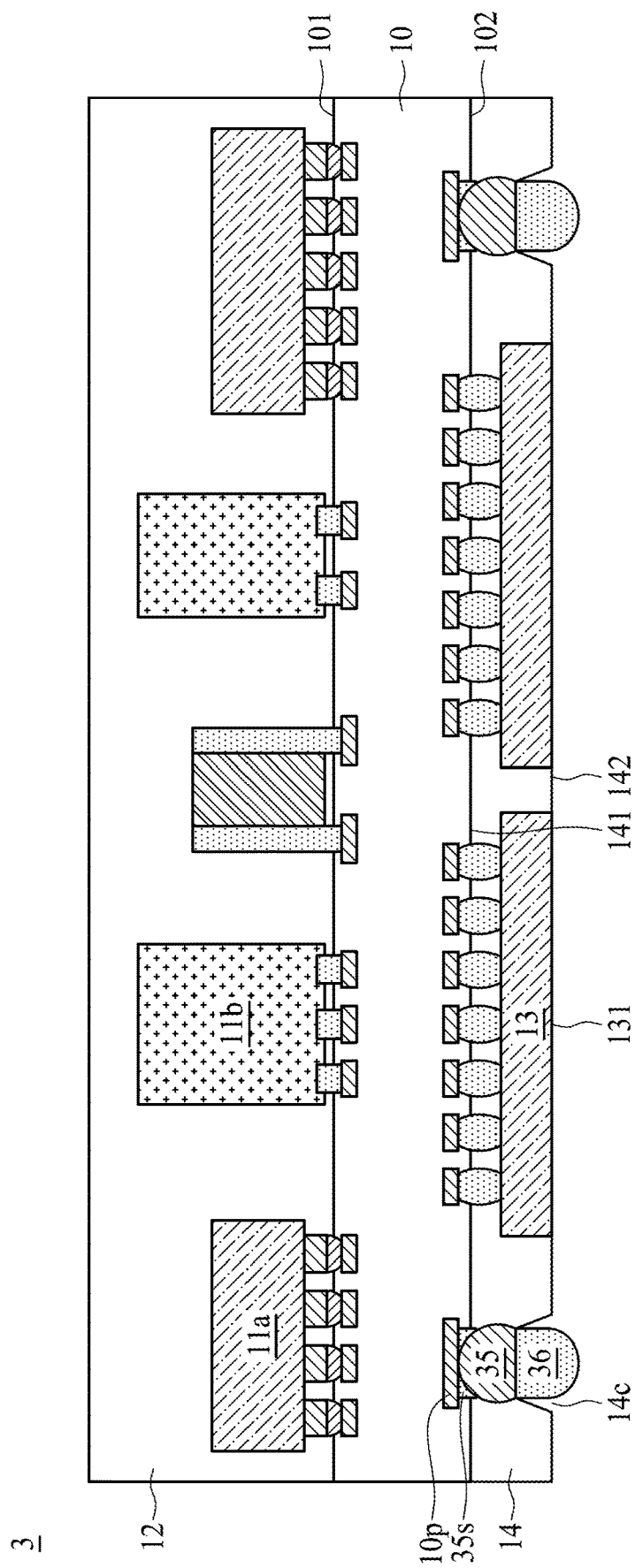
FIG. 3A illustrates a cross-sectional view of a semiconductor device package according to some embodiments of the present disclosure.

FIG. 3A is a cross-sectional view of a semiconductor device package 3 in accordance with some embodiments of the present disclosure. The semiconductor device package 3 is similar to the semiconductor device package 1 in FIG. 1A except that an electrical contact 35 of the semiconductor device package 3 is an entire high-melting-point metal ball (e.g. a copper ball or a high-melting-point solder ball).

The encapsulant 14 covers or encapsulates a portion of the electrical contact 35. The encapsulant 14 partially exposes another portion of the electrical contact 35. The portion of the electrical contact 35 is a high-melting-point portion. A solder paste 36 is disposed on the exposed portion of the electrical contact 35 to provide electrical connections. The solder paste 36 may act as a conductive pad. The solder paste 36 can prevent the electrical contact 35 from oxidation and facilitate the connection between the semiconductor device package 3 and any other devices or elements. The encapsulant 14 includes the recess 14c to accommodate the electrical contact 35 and the solder paste 36. The encapsulant 14 is spaced apart from the solder paste 36.

Figure 3B:
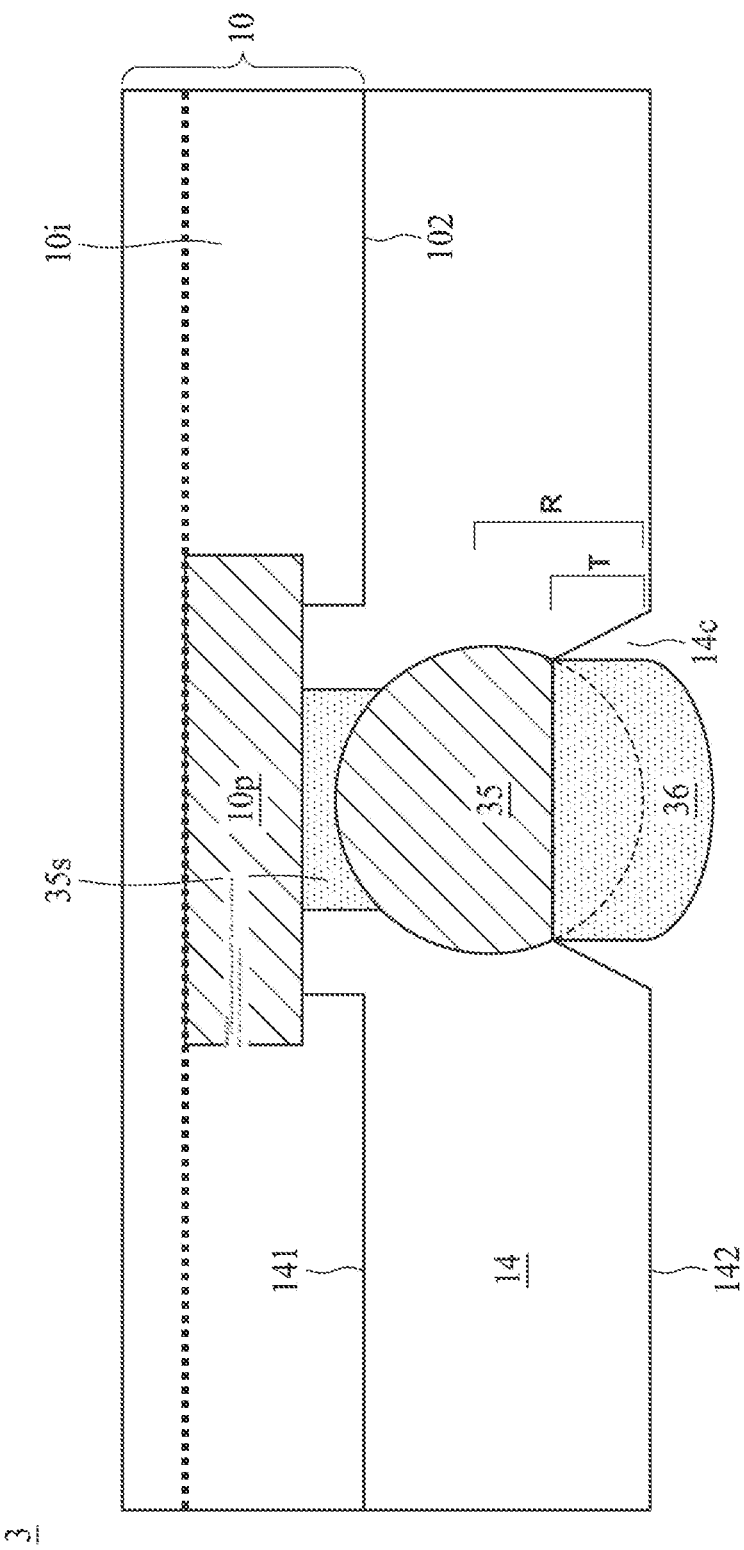
FIG. 3B illustrates a cross-sectional view of an enlarged view of a portion of a semiconductor device package according to some embodiments of the present disclosure.

FIG. 3B is a cross-sectional view of an enlarged view of a portion of the semiconductor device package 3 according to some embodiments of the present disclosure. The electrical contact 35 may be a copper ball. In some embodiments, the electrical contact 35 may be covered by a Ni layer. In some embodiments, the thickness of the Ni layer is about 1 μm. The electrical contact 35 is connected to the conductive pad 10p of the substrate 10 through a solder paste 35s. A thickness of the electrical contact 35 exposed from the encapsulant 14 is less than a radius of the electrical contact 35.

The substrate 10 includes the dielectric layer 10i. The dielectric layer 10i partially covers the conductive pad 10p. The dielectric layer 10i is spaced apart from the solder paste 35s and the electrical contact 35. The encapsulant 14 is in contact with the dielectric layer 10i, the conductive pad 10p, the solder paste 35s, and the electrical contact 35. The encapsulant 14 is in contact with the high-melting-point part of the electrical contact 35.

The diameter of the electrical contact 35 is equal to or less than the thickness of the encapsulant 14. The electrical contact 35 may not protrude beyond the surface 142 of the encapsulant 14 to provide electrical connections. Therefore, the solder paste 36 (e.g., solder pad) can be formed on the electrical contact 35 to prevent the electrical contact 35 from oxidation and to provide better electrical connections between the semiconductor device package 3 and any other devices or elements. This arrangement would reduce the size of the electrical contact 35, which is applicable to fine-pitch connections.

Figure 3C:
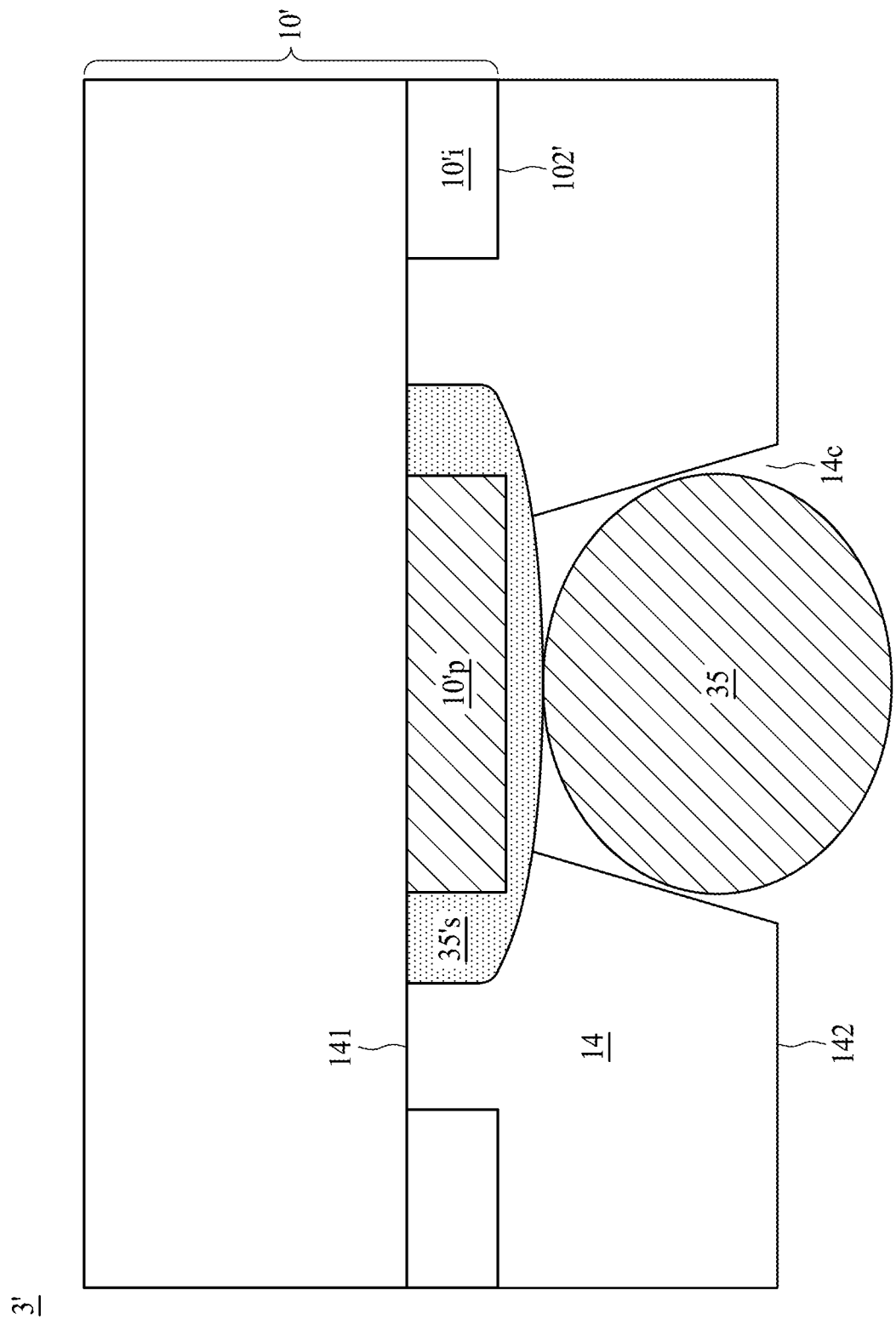
FIG. 3C illustrates a cross-sectional view of an enlarged view of a portion of a semiconductor device package according to some embodiments of the present disclosure.

FIG. 3C is a cross-sectional view of an enlarged view of a portion of a semiconductor device package 3' according to some embodiments of the present disclosure. The semiconductor device package 3' is similar to the semiconductor device package 3 in FIG. 3B except that the solder paste 35's completely covers a conductive pad 10'p of a substrate 10'. The substrate 10' includes a dielectric layer 10'i. The dielectric layer 10'i is spaced apart from the solder paste 35's. The solder paste 35's is partially exposed by the recess 14c of the encapsulant 14.

The encapsulant 14 is in contact with the dielectric layer 10'i and the solder paste 35's. The encapsulant 14 is in contact with the electrical contact 35. In some embodiments, encapsulant 14 is spaced apart from the electrical contact 35.

In some embodiments, a solder paste may be formed on the electrical contact 35 to prevent from oxidation, if specified.

Figure 4A:
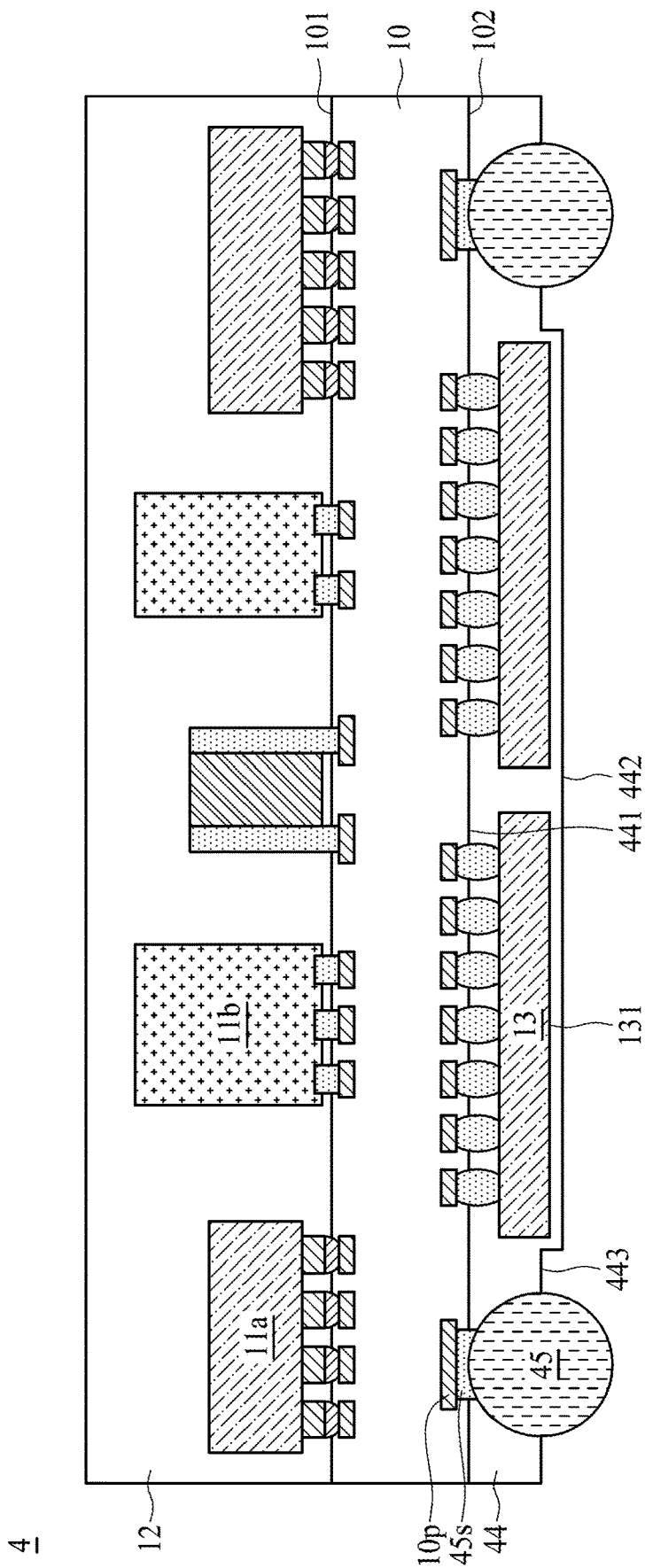
FIG. 4A illustrates a cross-sectional view of a semiconductor device package according to some embodiments of the present disclosure.

FIG. 4A is a cross-sectional view of a semiconductor device package 4 in accordance with some embodiments of the present disclosure. The semiconductor device package 4 is similar to the semiconductor device package 1 in FIG. 1A except that an electrical contact 45 is an entire metal ball and that an encapsulant 44 has a step profile.

The encapsulant 44 is disposed on the lower surface 102 of the substrate 10 to cover or encapsulate the electronic component 13. The encapsulant 44 includes an upper surface 441, a lower surface 442 opposite to the upper surface 441, and a lower surface 443 between the upper surface 441 and the lower surface 442. A distance between the lower surface 442 of the encapsulant 44 and the lower surface 102 of the substrate 10 is greater than a distance between the lower surface 443 of the encapsulant 44 and the lower surface 102 of the substrate 10.

The electrical contact 45 is disposed on the solder paste 45s. The electrical contact 45 is exposed by the encapsulant 44. A thickness (e.g. the distance between the upper surface 441 and the lower surface 443) of the encapsulant 44 may be flexibly adjusted depending on different design specifications.

The electrical contact 45 includes copper (Cu), alloy (e.g. CuAg or CuAu), or a high-melting-point solder material (e.g. high-melting-point Sn).

Figure 4B:
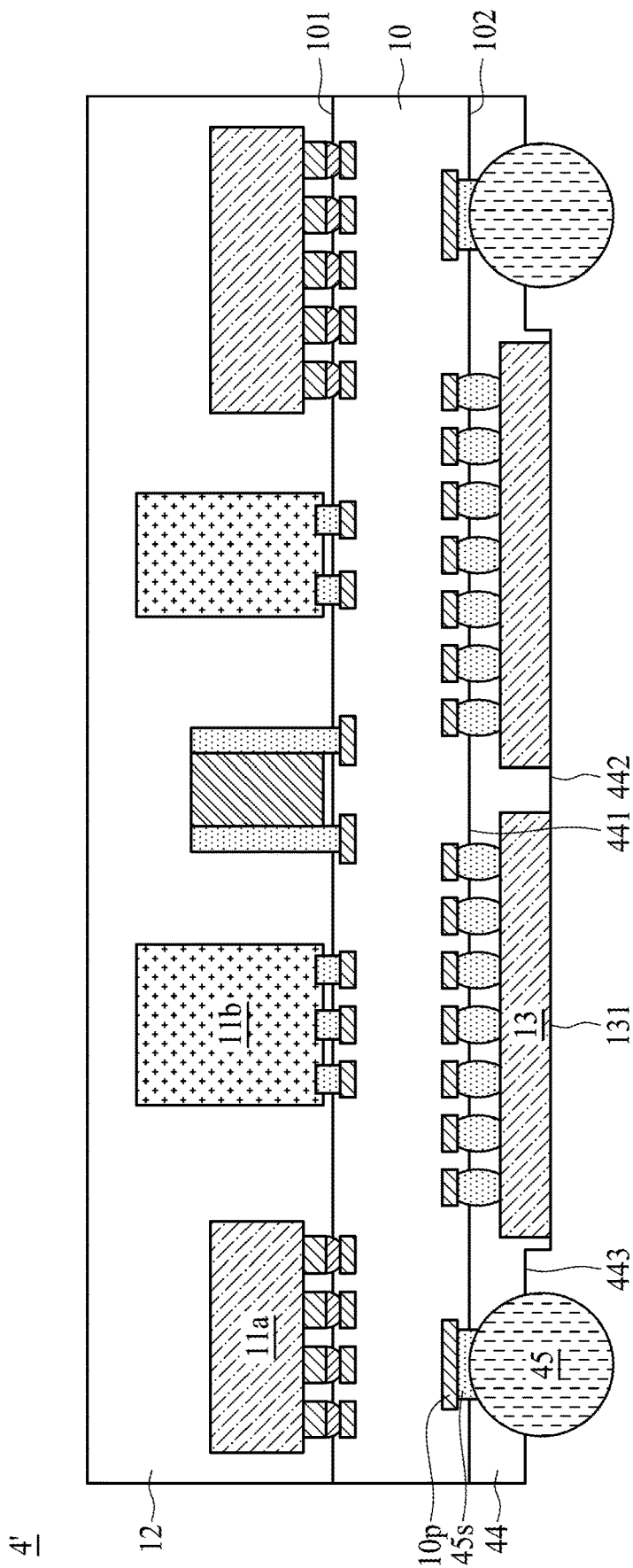
FIG. 4B illustrates a cross-sectional view of a semiconductor device package according to some embodiments of the present disclosure.

FIG. 4B is a cross-sectional view of a semiconductor device package 4' in accordance with some embodiments of the present disclosure. The semiconductor device package 4' is similar to the semiconductor device package 4 in FIG. 4A except that the surface 131 of the electronic component 13 is exposed by the encapsulant 44. The surface 131 of the electronic component 13 and the lower surface 442 of the encapsulant 44 are substantially coplanar.

Figure 4C:
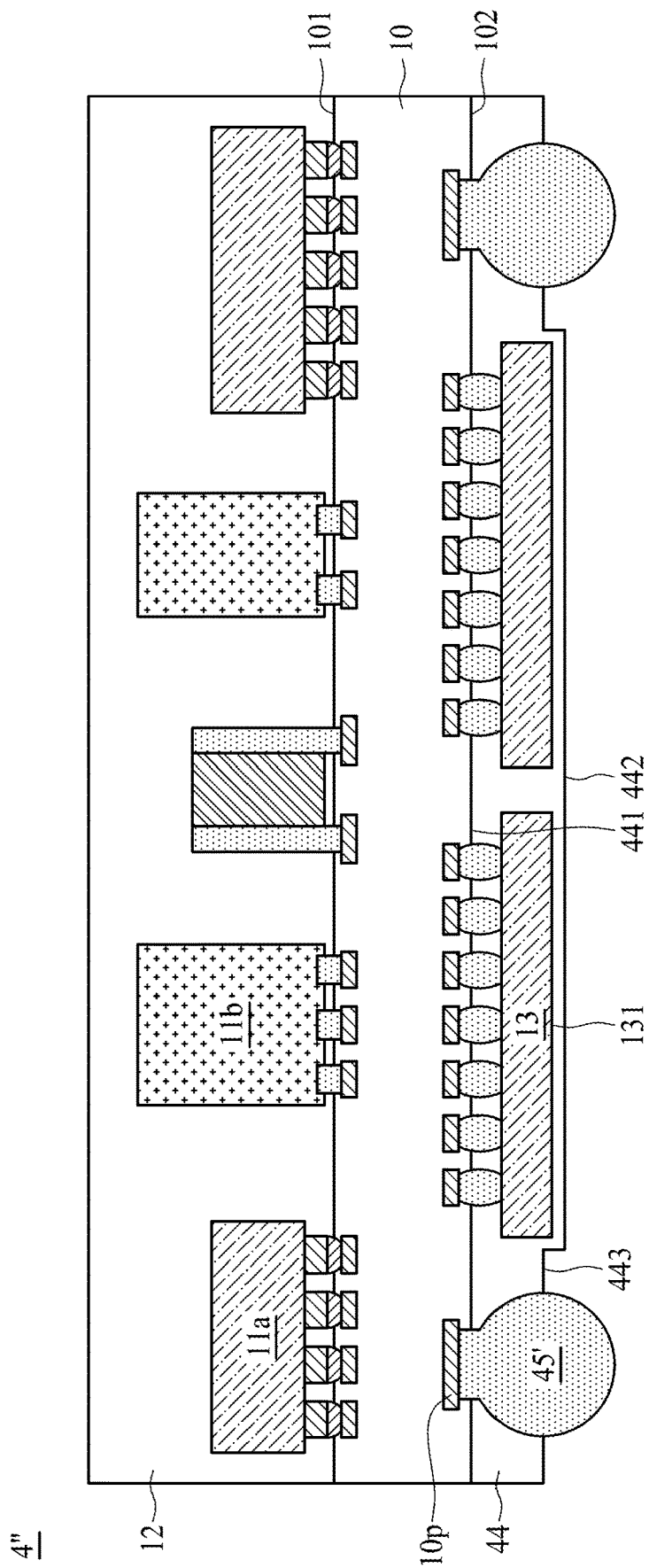
FIG. 4C illustrates a cross-sectional view of a semiconductor device package according to some embodiments of the present disclosure.

FIG. 4C is a cross-sectional view of a semiconductor device package 4" in accordance with some embodiments of the present disclosure. The semiconductor device package 4" is similar to the semiconductor device package 4 in FIG. 4A except that an electrical contact 45' includes a solder material. The electrical contact 45' is disposed on the conductive pad 10p. The electrical contact 45' is in contact with the substrate 10 and the encapsulant 44. The electrical contact 45' is formed integrally.

Figure 5A:
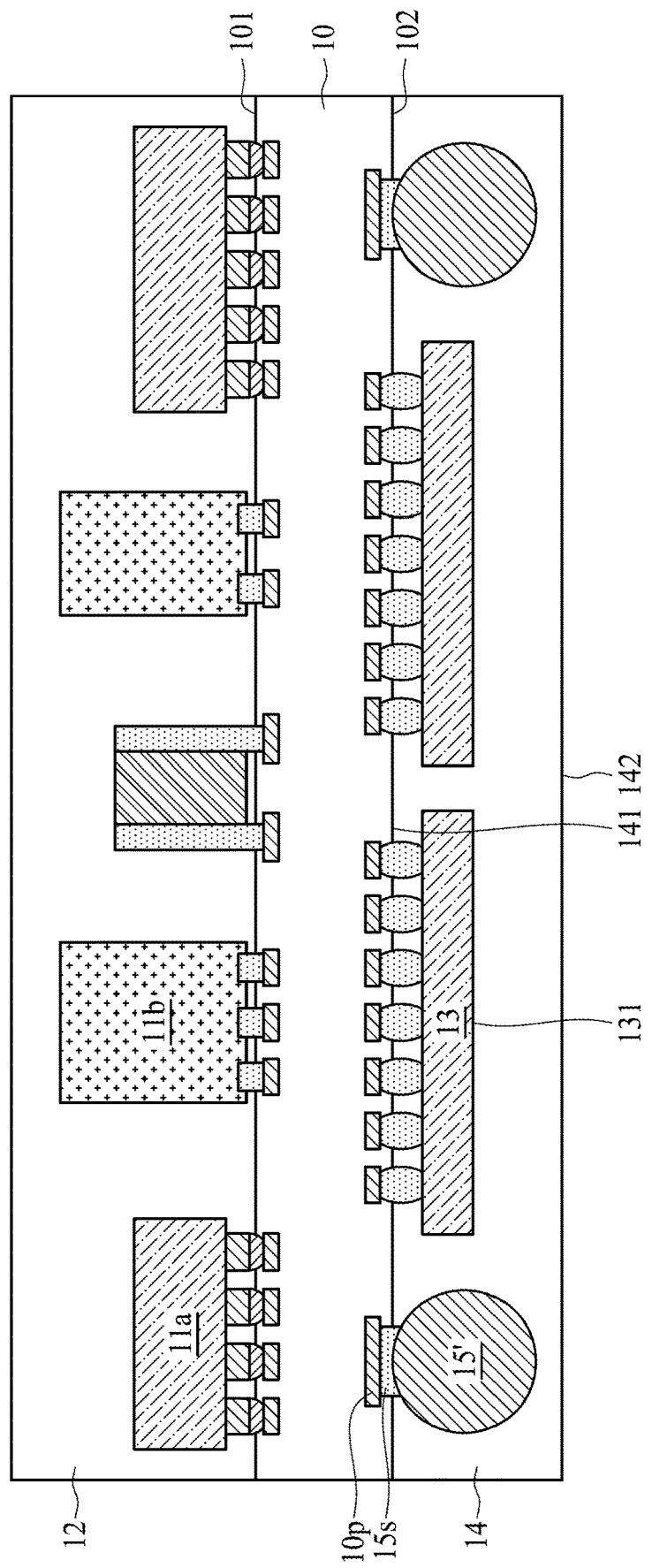
FIG. 5A, FIG. 5B, and FIG. 5C illustrate a method of manufacturing a semiconductor device package according to some embodiments of the present disclosure.
Figure 5B:
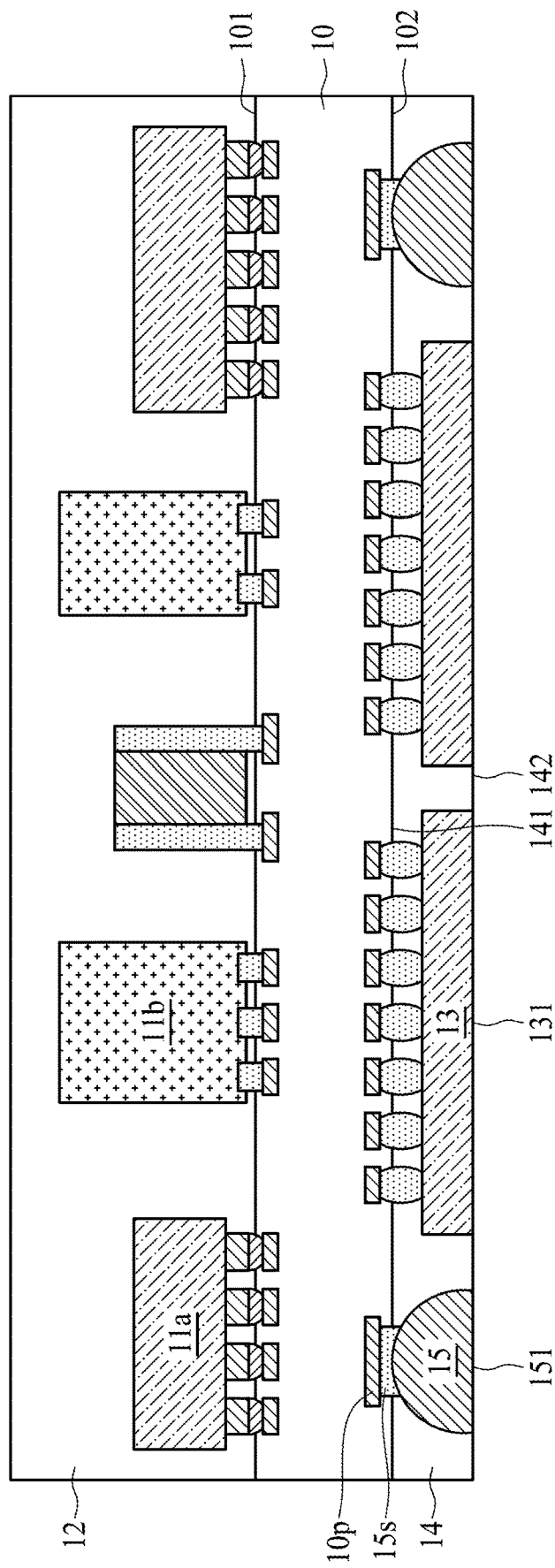
Figure 5C:
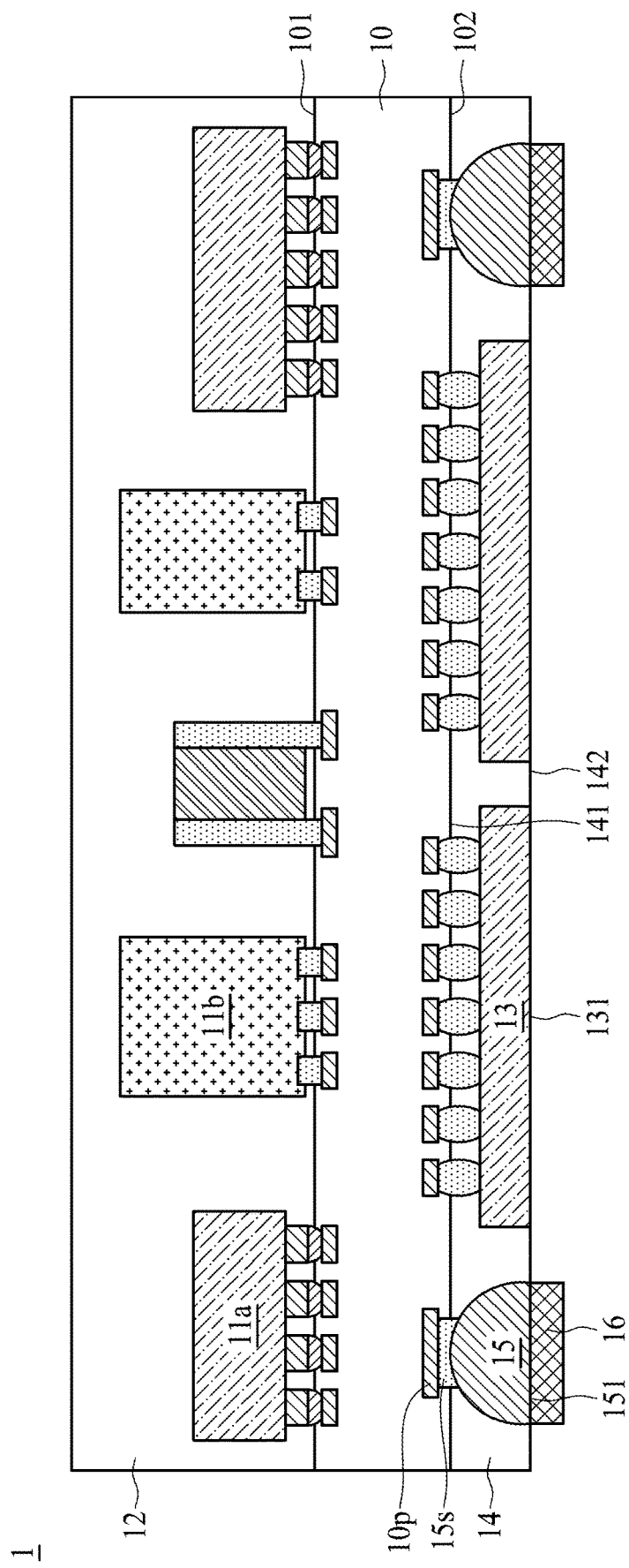

FIG. 5A through FIG. 5C illustrate some embodiments of a method of manufacturing the semiconductor device package 1 according to some embodiments of the present disclosure. Various figures have been simplified to more clearly present aspects of the present disclosure.

Referring to FIG. 5A, a method for manufacturing the semiconductor device package 1 includes providing a substrate 10. The solder paste 15s is disposed on the substrate 10. The electronic components 11a and 11b are disposed on the upper surface 101 of the substrate 10. The electronic component 13 and a metal ball 15' are disposed on the lower surface 102 of the substrate 10. The metal ball 15' is disposed on the solder paste 15s. In some embodiments, the metal ball 15' can be formed by ball drop, screen printing, plating or any other suitable operations. The encapsulants 12 and 14 are respectively formed on the upper surface 101 and the lower surface 102 of the substrate 10 to fully cover the electronic components 11a, 11b, and 13 and the metal ball 15'. In some embodiments, the encapsulants 12 and 14 are formed in a single molding operation. Alternatively, the encapsulants 12 and 14 can be formed in separate molding operations.

In some embodiments, the metal ball 15' is formed of or includes copper (Cu), alloy (e.g. CuAg or CuAu), or a high-melting-point solder material (e.g. high-melting-point Sn). A melting point of the metal ball 15' is greater than that of the solder paste 15s. The metal ball 15' would not be affected by a reflow operation or any subsequent high temperature operations.

Referring to FIG. 5B, a portion of the encapsulant 14 and the metal ball 15' are removed to form an electrical contact 15 and expose a backside 131 of the electronic component 13. In some embodiments, the encapsulant 14 and the metal ball 15' are removed by, for example, a grinding operation or any other suitable operations. In some embodiments, a half of the metal ball 15' is removed. Removing a portion of the encapsulant 14 and solder ball 15' could promote the uniformity of the thickness of the encapsulant 14. For example, the uniformity of the thickness of the encapsulant 14 can be improved from +/−30 μm to +/−10 μm. Furthermore, no residual resin would remain on the electronic component 13. A grinded surface 151 of the electrical contact 15 has an interface with exposed grains. In some embodiments, the electrical contact 15 and the solder paste 16 which include different materials may show different colors at the interface. The electrical contact 15 includes a high-melting-point part. A melting point of the high-melting-point part of the electrical contact 15 is greater than that of the solder paste 15s.

Referring to FIG. 5C, a distance between the lower surface 102 of the substrate 10 and the grinded surface 151 of the electrical contact 15 may be equal to, less than or greater than a radius of an entire metal ball. A solder paste 16 is formed on the grinded surface 151 of the electrical contact 15 to form the semiconductor device package 1 as shown in FIG. 1A. In some embodiments, the solder paste 16 may be formed by printing. In some embodiments, compared to existing double-sided molding modules, the thickness of the semiconductor device package 1 can be reduced to 0.7 millimeters (mm) or thinner. In addition, the bottom side mold cap can be reduced (e.g., from 180 μm to 80 μm). The solder paste 15s spreads onto the electrical contact 15 during a heat operation. The solder paste 16 spreads onto the electrical contact 15 during a heat operation.

Figure 6A:
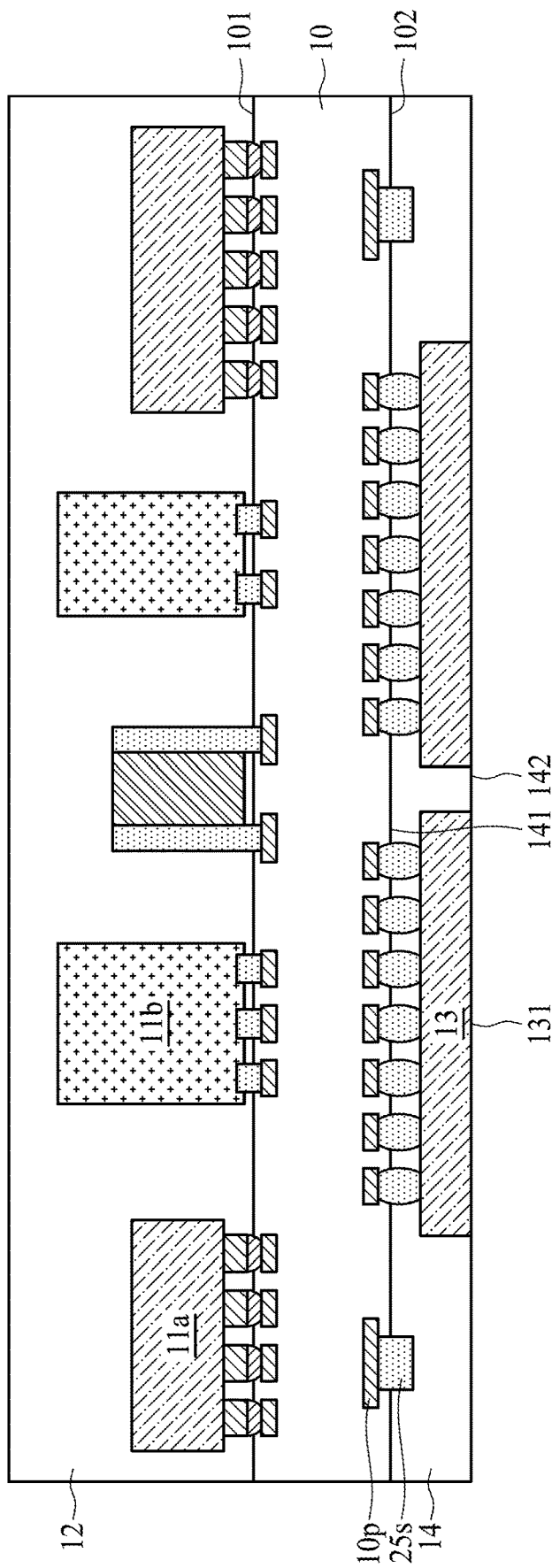
FIG. 6A, FIG. 6B, and FIG. 6C illustrate a method of manufacturing a semiconductor device package according to some embodiments of the present disclosure.
Figure 6B:
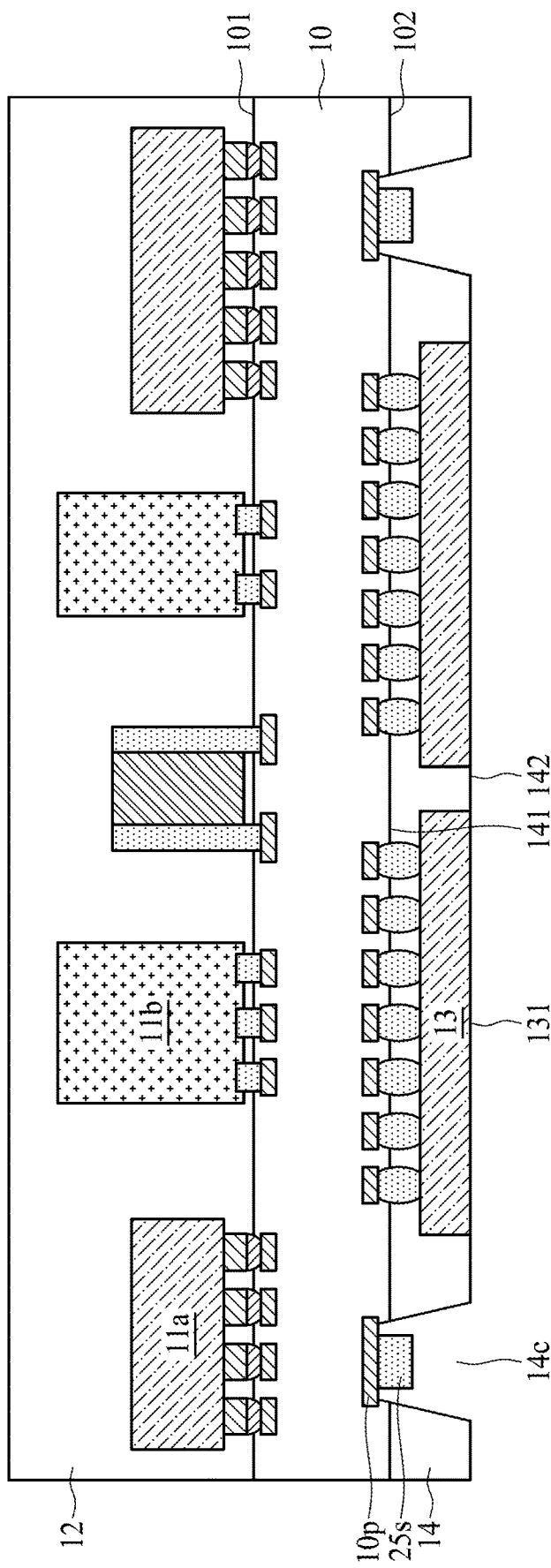
Figure 6C:
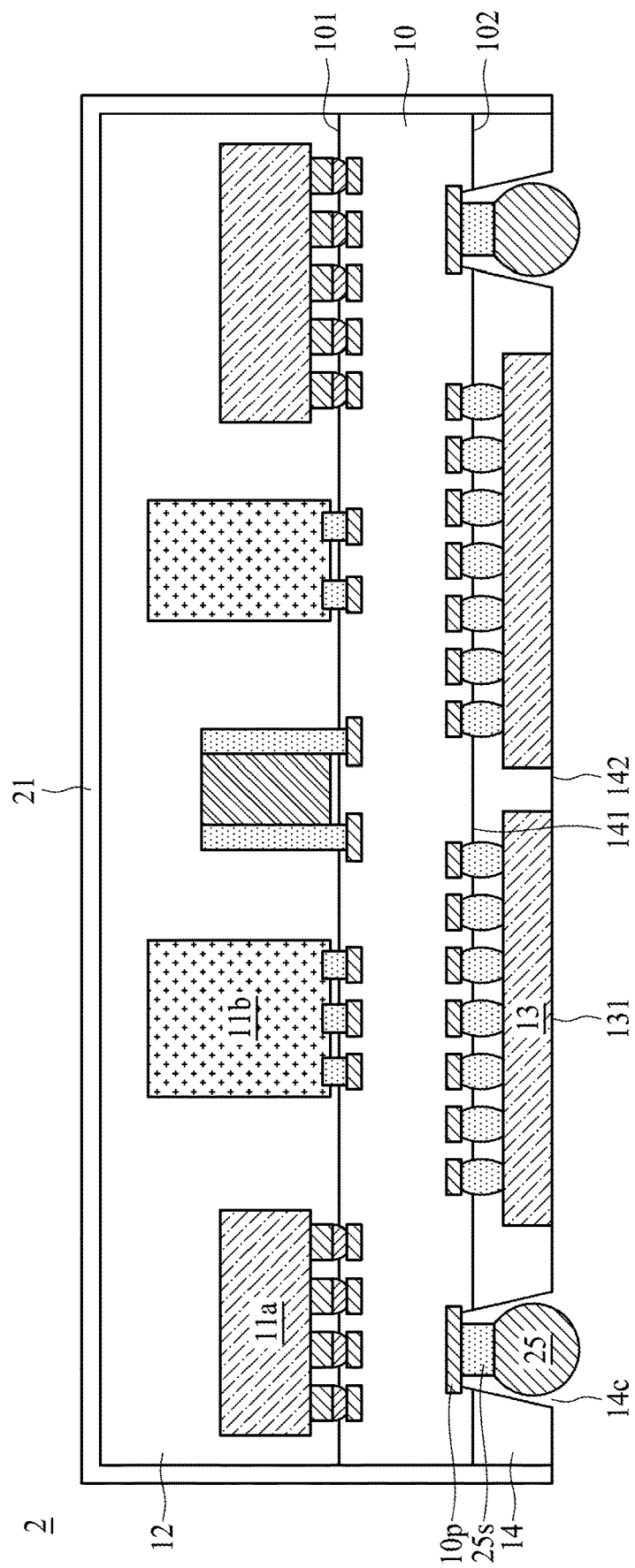

FIG. 6A through FIG. 6C illustrate some embodiments of a method of manufacturing the semiconductor device package 2 according to some embodiments of the present disclosure. Various figures have been simplified to more clearly present aspects of the present disclosure.

Referring to FIG. 6A, the substrate 10 is provided. The solder paste 25s is disposed on the substrate 10. The electronic components 11a and 11b are disposed on the upper surface 101 of the substrate 10. The electronic component 13 and the solder paste 25s are disposed on the lower surface 102 of the substrate 10. The solder paste 25s is disposed on the conductive pad 10p. The encapsulants 12 and 14 are formed on the upper surface 101 and the lower surface 102 of the substrate 10 to fully cover the electronic components 11a, 11b and 13 and the solder paste 25s. In some embodiments, the encapsulants 12 and 14 are formed in a single molding operation. Alternatively, the encapsulants 12 and 14 can be formed in separate molding operations. In some embodiments, a grinding operation can be further carried out to expose the backside 131 of the electronic component 13.

Referring to FIG. 6B, one or more recesses 14c are formed to penetrate the encapsulant 14 to expose the solder paste 25s. In some embodiments, the recesses 14c may be formed by laser ablation or any other suitable operations. Since the electrical contact 25 to be formed in the recess 14c would not be affected by a reflow operation, the size of the recess 14c may be as small as possible. Accordingly, an offset window for operations may be increased.

Referring to FIG. 6C, the electrical contact 25 is formed within the recess 14c to form the semiconductor device package 2 as shown in FIG. 2A. A conductive layer 21 is disposed on the encapsulants 12 and 14 and a portion of the substrate 10. In some embodiments, the electrical contact 25 may be formed by ball drop. The solder paste 25s may join the electrical contact 25 to the conductive pad 10p. The electrical contact 25 protrudes beyond the lower surface 142 of the encapsulant 14. In some embodiments, a solder paste may be formed on the electrical contact 25 to prevent from oxidation, if specified. The solder paste 25s spreads onto the electrical contact 25 during a heat operation.

The electrical contact 25 includes a high-melting-point part. A melting point of the high-melting-point part of the electrical contact 25 is greater than that of the solder paste 25s.

Under the spirit of the present disclosure, the operations of FIGS. 6A to 6C may be applied for the package structures as illustrated and described with reference to FIGS. 2C to 2E.

FIG. 7A through FIG. 7D illustrate some embodiments of a method of manufacturing the semiconductor device package 3 according to some embodiments of the present disclosure. Various figures have been simplified to more clearly present aspects of the present disclosure.

Figure 7A:
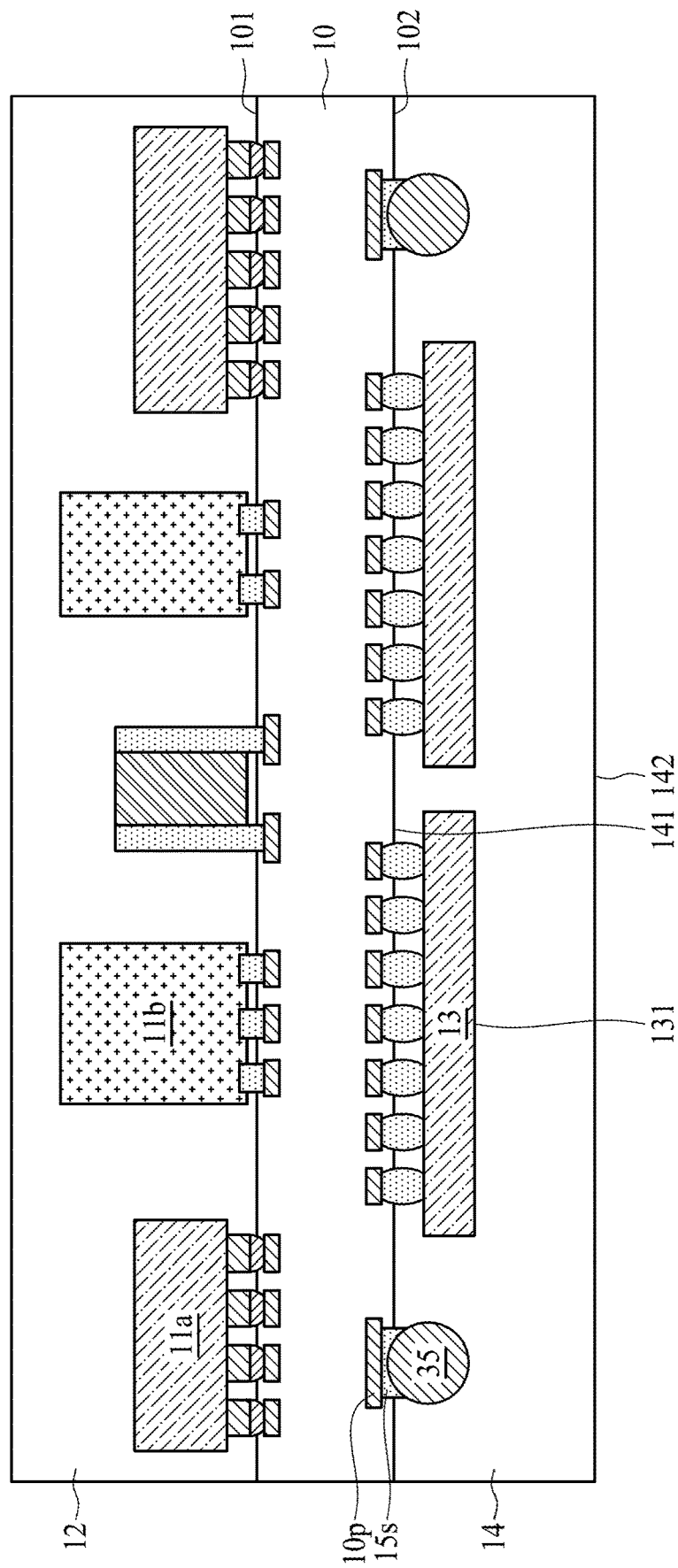
FIG. 7A, FIG. 7B, FIG. 7C, and FIG. 7D illustrate a method of manufacturing a semiconductor device package according to some embodiments of the present disclosure.

Referring to FIG. 7A, the method for manufacturing the semiconductor device package 3 includes providing a substrate 10. The solder paste 35s is disposed on the substrate 10. The electronic components 11a and 11b are disposed on the upper surface 101 of the substrate 10. The electronic component 13 and the electrical contact 35 are disposed on the lower surface 102 of the substrate 10. The electrical contact 35 is disposed on the solder paste 35s. The encapsulant 14 is formed on the lower surface 102 of the substrate 10 to fully cover the electronic component 13 and the electrical contact 35. In some embodiments, the encapsulants 12 and 14 are formed in a single molding operation. Alternatively, the encapsulants 12 and 14 can be formed in separate molding operations.

The electrical contact 35 includes a high-melting-point part. A melting point of the high-melting-point part of the electrical contact 35 is greater than that of the solder paste 35s.

Figure 7B:
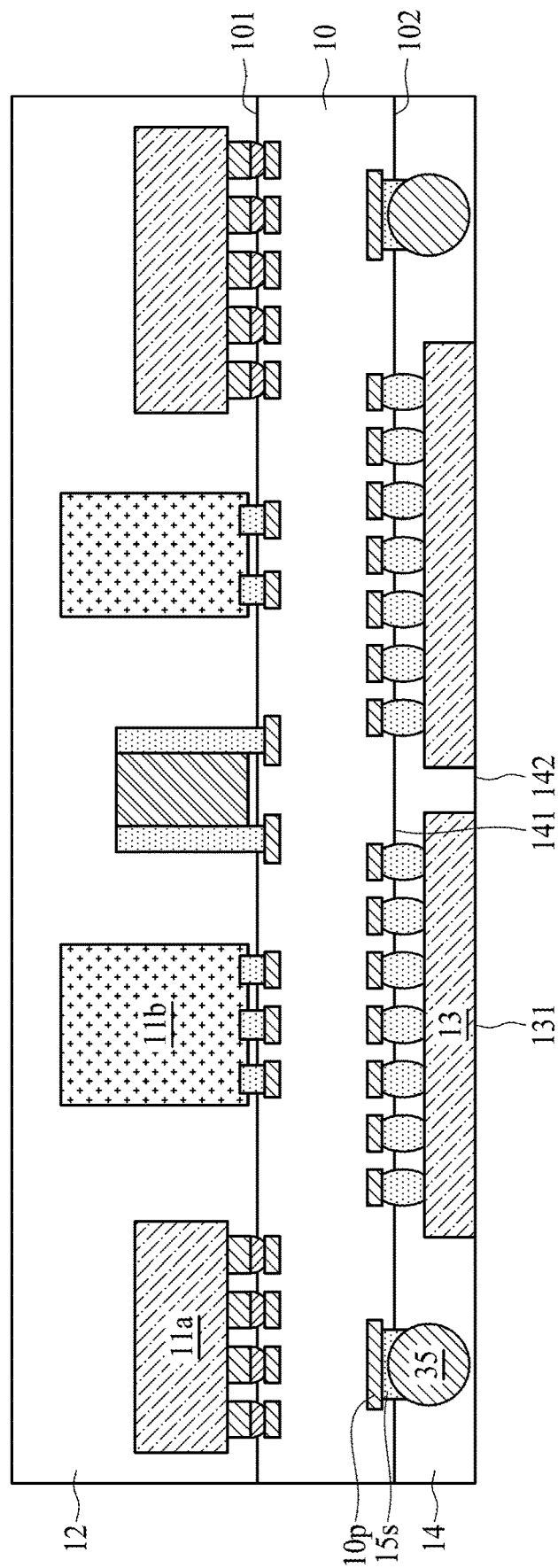

Referring to FIG. 7B, a portion of the encapsulant 14 is removed to expose the backside 131 of the electronic component 13. In some embodiments, the encapsulant 14 is removed by, for example, a grinding operation or any other suitable operations. The electrical contact 35 is still covered and encapsulated by the encapsulant 14.

Figure 7C:
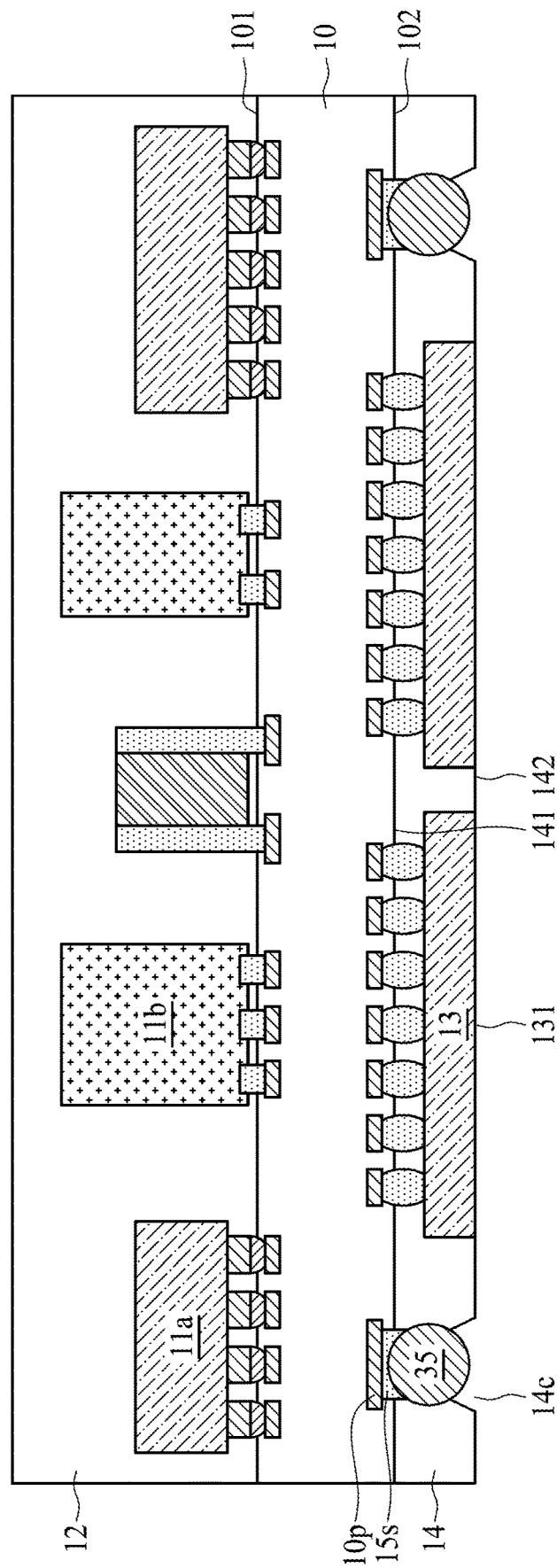

Referring to FIG. 7C, one or more recesses 14c are formed to expose the electrical contacts 35. In some embodiments, the recesses 14c may be formed by laser ablation or any other suitable operations.

Figure 7D:
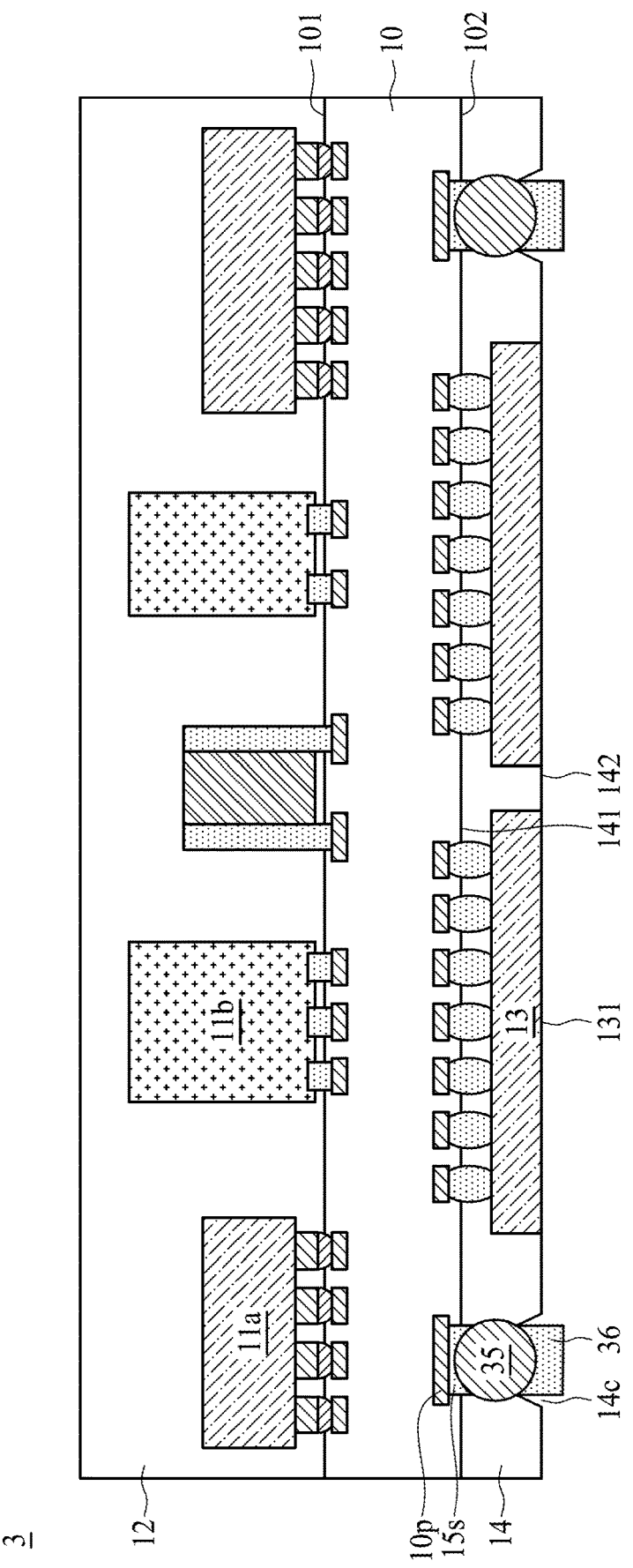

Referring to FIG. 7D, the solder paste 36 is formed by printing to cover the exposed portion of the electrical contacts 35. The solder paste 36 may prevent the electrical contact 35 from oxidation and provide better electrical connections between the semiconductor device package 3 and any other devices or elements. The solder paste 35s spreads onto the electrical contact 35 during a heat operation. The solder paste 36 spreads onto the electrical contact 35 during a heat operation.

Figure 8A:
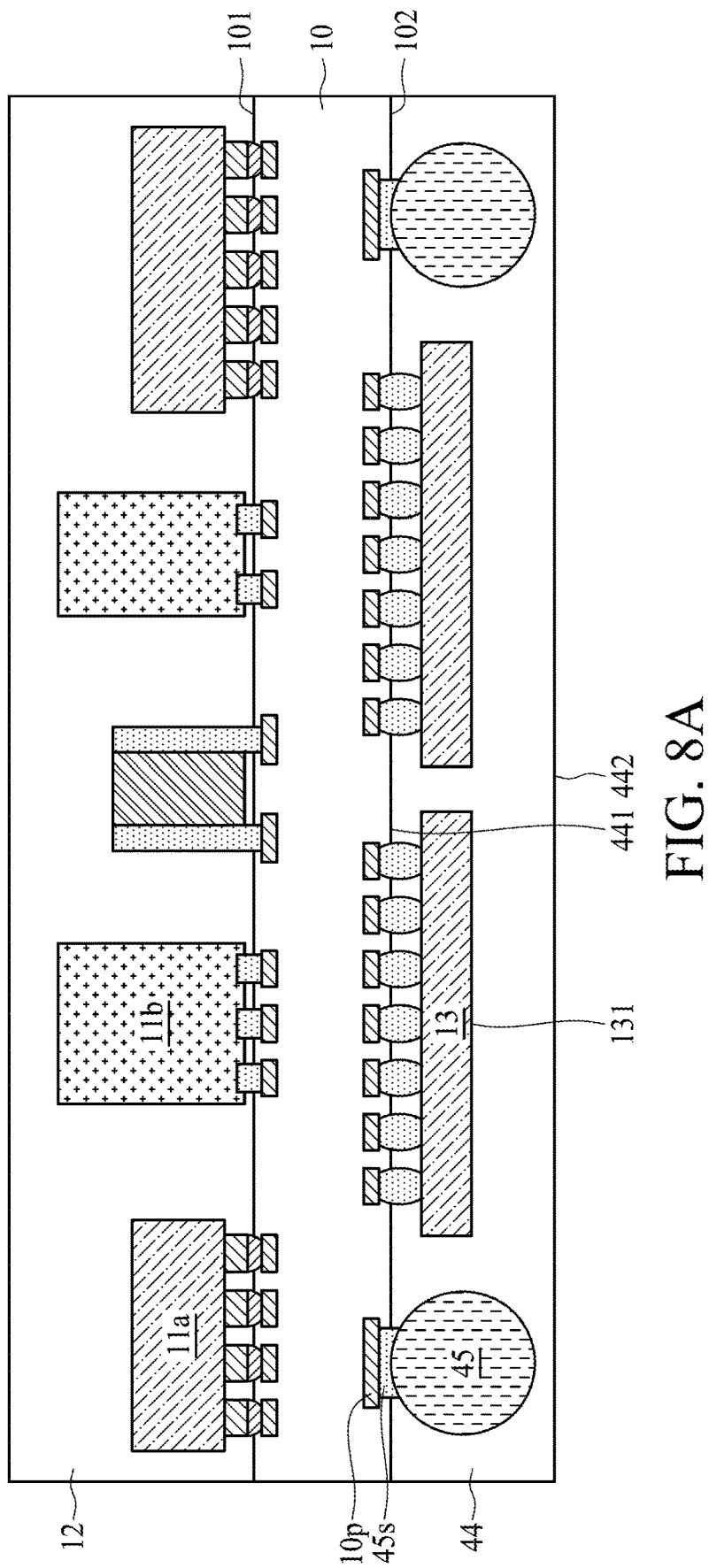
FIG. 8A and FIG. 8B illustrate a method of manufacturing a semiconductor device package according to some embodiments of the present disclosure.
Figure 8B:
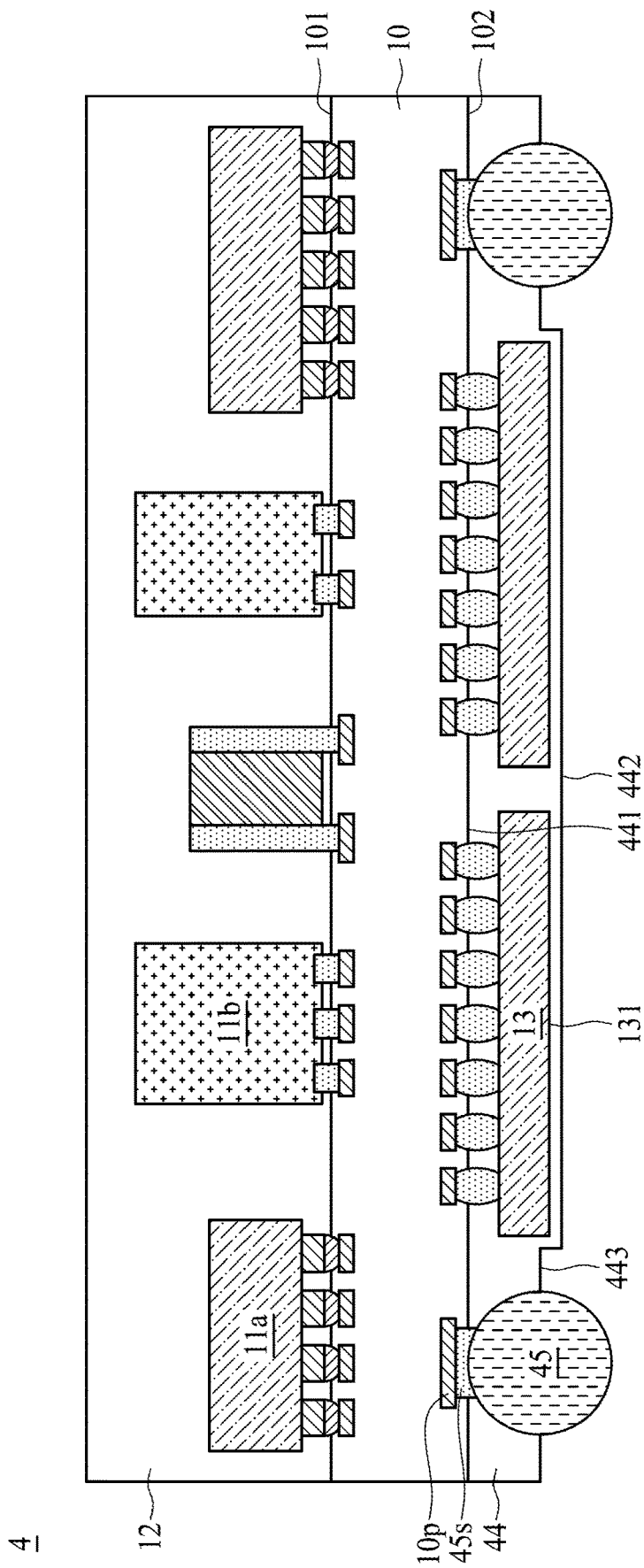

FIG. 8A through FIG. 8B illustrate some embodiments of a method of manufacturing the semiconductor device package 4 according to some embodiments of the present disclosure. Various figures have been simplified to more clearly present aspects of the present disclosure.

Referring to FIG. 8A, the method for manufacturing the semiconductor device package 4 includes providing a substrate 10. The solder paste 45s is disposed on the substrate 10. The electronic components 11a and 11b are disposed on the upper surface 101 of the substrate 10. The electronic component 13 and the electrical contact 45 are disposed on the lower surface 102 of the substrate 10. The electrical contact 45 is disposed on the solder paste 45s. The solder balls 45 can be formed by ball drop, screen printing, plating or any other suitable operations. The encapsulant 44 is formed on the lower surface 102 of the substrate 10 to fully cover the electronic component 13 and the electrical contact 45. In some embodiments, the encapsulants 12 and 44 are formed in a single molding operation. Alternatively, the encapsulants 12 and 44 can be formed in separate molding operations.

The electrical contact 45 includes a high-melting-point part. A melting point of the high-melting-point part of the electrical contact 45 is greater than that of the solder paste 45s.

Referring to FIG. 8B, a portion of the encapsulant 44 is removed to partially expose the electrical contact 45 to form the semiconductor device package 4 in FIG. 4A. The encapsulant 44 includes a step profile. In some embodiments, the encapsulant 44 can be removed by laser polish or plasma etching operation. The thickness of the encapsulant 44 may be flexibly defined. For example, the distance between the surfaces 441 and 442 of the encapsulant 44 may be adjusted. The distance between the surfaces 441 and 443 of the encapsulant 44 may be adjusted. In some embodiments, a solder paste may be formed on the electrical contact 45 to prevent from oxidation, if specified. The solder paste 45s spreads onto the electrical contact 45 during a heat operation.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a substrate having a conductive pad;
an electrical contact disposed under the substrate;
a first electronic component disposed under the substrate;

a first encapsulant encapsulating the first electronic component; and a second electronic component between the first electronic component and the electrical contact, wherein a distance between the first electronic component and the second electronic component is less than a thickness of the substrate, wherein the first encapsulant includes a bottom surface, and a recess is recessed from the bottom surface of the first encapsulant, and wherein a first lateral wall of the recess vertically overlaps the conductive pad of the substrate from a cross-sectional view.

2. The semiconductor device package of claim 1, further comprising:

a third electronic component disposed over the substrate; and a second encapsulant encapsulating the third electronic component, wherein an active surface of the first electronic component and an active surface of the third electronic component face the substrate.

3. The semiconductor device package of claim 1, wherein the recess has a lateral surface in contact with the electrical contact.

4. The semiconductor device package of claim 1, wherein the recess has a top surface spaced apart from the substrate.

5. The semiconductor device package of claim 4, wherein a first horizontal width of the electrical contact at an elevation of the top surface of the recess is greater than a second horizontal width of the electrical contact at other elevation.

6. The semiconductor device package of claim 4, wherein the top surface of the recess extends to an outmost lateral surface of the first encapsulant.

7. The semiconductor device package of claim 6, wherein a second lateral wall of the recess is closer to the first electronic component than the electrical contact.

8. The semiconductor device package of claim 1, further comprising a fourth electronic component between the first electronic component and an outmost lateral surface of the first encapsulant, wherein a distance between the first electronic component and the second electronic component is less than a distance between the second electronic component and the outmost lateral surface of the first encapsulant.

9. The semiconductor device package of claim 1, further comprising a solder paste disposed between the conductive pad of the substrate and the electrical contact.

10. The semiconductor device package of claim 9, wherein the solder paste is spaced apart from a dielectric layer of the substrate.

11. The semiconductor device package of claim 10, wherein the conductive pad of the substrate is embedded in a dielectric layer of the substrate, and a portion of a bottom surface of the conductive pad is covered by the dielectric layer.

12. The semiconductor device package of claim 11, wherein the dielectric layer of the substrate defines an opening to expose a portion of the top surface of the conductive pad, and wherein a solder paste is disposed in the opening and connected to the portion of the bottom surface of the conductive pad.

13. The semiconductor device package of claim 11, wherein the first encapsulant covers a lateral surface of the dielectric layer.

14. The semiconductor device package of claim 9, wherein the solder paste is spaced apart from the first encapsulant by the recess.

15. The semiconductor device package of claim 9, wherein a melting point of the electrical contact is greater than a melting point of the solder paste.

16. The semiconductor device package of claim 1, wherein a solder paste at least partially overlaps the substrate and the first encapsulant in a direction substantially parallel to a bottom surface of the substrate.

17. A semiconductor device package, comprising:

a substrate;

a first electrical contact disposed on the substrate;

a first electronic component; and an encapsulant around the first electrical contact, the encapsulant having a first surface, a second surface opposite to the first surface, a first inner lateral surface, and a second inner lateral surface opposite to the first inner lateral surface, and a second electronic component between the first electronic component and the first electrical contact, wherein a distance between the first electronic component and the second electronic component is less than a thickness of the substrate, wherein the first inner lateral surface has a first radius of curvature, and wherein the first inner lateral surface and the second inner lateral surface continuously extend from the first surface of the encapsulant to the second surface of the encapsulant and extend away from each other.

18. The semiconductor device package of claim 17, wherein a conductive pad of the substrate is disposed over the electrical contact, and wherein the conductive pad is electrically connected to the electrical contact.

19. The semiconductor device package of claim 17, further comprising a conductive shielding layer covering a lateral surface of the substrate and a lateral surface of the encapsulant.

* * * * *